United States Patent
Ikegami et al.

(10) Patent No.: US 11,715,527 B2
(45) Date of Patent: Aug. 1, 2023

(54) SEMICONDUCTOR STORAGE DEVICE HAVING FIRST AND SECOND MEMORY STRINGS FORMED ON OPPOSITE SIDES OF THE SAME PILLAR AND METHOD OF PERFORMING A READ OPERATION THEREIN

(71) Applicant: KIOXIA CORPORATION, Tokyo (JP)

(72) Inventors: Kazutaka Ikegami, Inagi Tokyo (JP); Hidehiro Shiga, Yokohama Kanagawa (JP); Takashi Maeda, Kamakura Kanagawa (JP); Rieko Funatsuki, Yokohama Kanagawa (JP); Takayuki Miyazaki, Setagaya Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/458,059

(22) Filed: Aug. 26, 2021

(65) Prior Publication Data
US 2022/0180942 A1    Jun. 9, 2022

(30) Foreign Application Priority Data
Dec. 3, 2020 (JP) .................................. 2020-201291

(51) Int. Cl.
*G11C 16/04*    (2006.01)
*G11C 16/26*    (2006.01)
(Continued)

(52) U.S. Cl.
CPC .......... *G11C 16/26* (2013.01); *G11C 16/0483* (2013.01); *G11C 16/08* (2013.01);
(Continued)

(58) Field of Classification Search
CPC ..... G11C 16/26; G11C 16/0483; G11C 16/08; G11C 16/20; G11C 16/30; G11C 16/32;
(Continued)

(56) References Cited

U.S. PATENT DOCUMENTS

| 2012/0134210 A1* | 5/2012 | Maeda ................... G11C 16/16 365/185.11 |
| 2017/0271021 A1* | 9/2017 | Futatsuyama .......... H10B 41/27 |
| 2018/0277565 A1* | 9/2018 | Futatsuyama .......... G11C 16/10 |

FOREIGN PATENT DOCUMENTS

| JP | 2017-168163 A | 9/2017 |
| JP | 2018-164070 A | 10/2018 |

* cited by examiner

*Primary Examiner* — Tha-O H Bui
(74) *Attorney, Agent, or Firm* — Kim & Stewart LLP

(57) ABSTRACT

A semiconductor storage device includes a semiconductor pillar, a first string having first memory cells connected in series, first word lines connected to the first memory cells, a second string having second memory cells connected in series, and second word lines connected to the second memory cells. Each of the first memory cells faces, and shares a channel in the semiconductor pillar with, one of the second memory cells. When reading data of the k-th first memory cell, a voltage of the first word line connected to the k-th first memory cell reaches a first voltage at a first timing, and a voltage of the second word line connected to at least one of the second memory cells other than the k-th second memory cell in the second string facing the k-th first memory cell reaches the first voltage at a second timing that is later than the first timing.

20 Claims, 21 Drawing Sheets

(51) Int. Cl.
  *G11C 16/08*  (2006.01)
  *G11C 16/30*  (2006.01)
  *G11C 16/20*  (2006.01)
  *H10B 41/27*  (2023.01)
  *H10B 43/27*  (2023.01)
(52) U.S. Cl.
  CPC .............. *G11C 16/20* (2013.01); *G11C 16/30* (2013.01); *H10B 41/27* (2023.02); *H10B 43/27* (2023.02)
(58) Field of Classification Search
  CPC ............. G11C 11/5642; G11C 11/5671; H01L 27/11556; H01L 27/11582; Y02D 10/00
  USPC ..................................................... 365/185.17
  See application file for complete search history.

SEMICONDUCTOR STORAGE DEVICE HAVING FIRST AND SECOND MEMORY STRINGS FORMED ON OPPOSITE SIDES OF THE SAME PILLAR AND METHOD OF PERFORMING A READ OPERATION THEREIN

CROSS-REFERENCE TO RELATED APPLICATION(S)

This application is based upon and claims the benefit of priority from. Japanese Patent Application No. 2020-201291, filed on Dec. 3, 2020, the entire contents of which are incorporated herein by reference.

FIELD

Embodiments described herein relate generally to a semiconductor storage device.

BACKGROUND

A memory system including a NAND flash memory as a semiconductor storage device and a controller for controlling the NAND flash memory is known.

DETAILED DESCRIPTION

Figure 1:
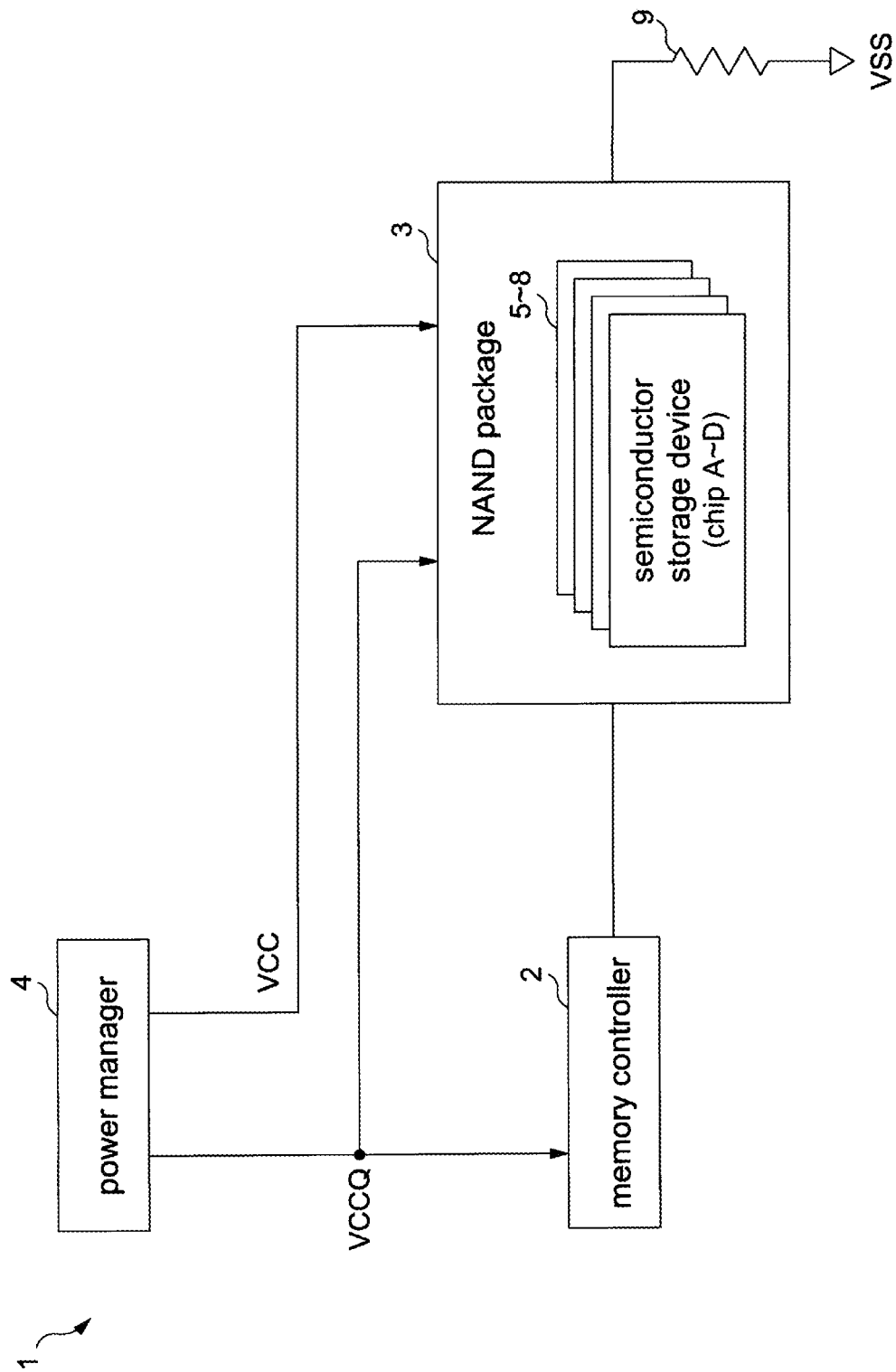
FIG. 1 is a block diagram illustrating a power supply system for a memory system according to embodiments.

Embodiments provide a semiconductor storage device capable of reducing power consumption.

In general, according to one embodiment, a semiconductor storage device includes a semiconductor pillar, a first string provided on a first side of the pillar and having a plurality of first memory cells connected in series, first word lines respectively connected to the plurality of first memory cells, a second string provided on a second side opposite to the first side with respect to the pillar and having a plurality of second memory cells connected in series, and second word lines respectively connected to the plurality of second memory cells. Each of the first memory cells faces, and shares a channel with, one of the second memory cells. When reading data of the k-th first memory cell in the first string, in an initial operation of the read operation, a voltage level of the first word line connected to the k-th first memory cell reaches a first voltage at a first timing, and a voltage level of the second word line connected to at least one of the second memory cells other than the k-th second memory cell in the second string facing the k-th first memory cell reaches the first voltage at a second timing that is later than the first timing.

Hereinafter, a nonvolatile semiconductor storage device according to an embodiment will be described in detail with reference to the drawings. In the following description, elements having substantially the same function and configuration will be denoted by the same reference numerals and will be described repeatedly only when necessary. Each embodiment described herein below is an example of a device or method for embodying the technical idea of the embodiment. The technical idea of the embodiment is not specifically limited to the materials, shapes, structures, arrangements, etc., of components described herein. The technical idea of the embodiment may be modified within the scope of the claims.

In the following description, a signal X<n:0> (n is a natural number) is an (n+1)-bit signal, and means a set of signals X<0>, X<1>, . . . , and X<n>, each of which is a one-bit signal. A component Y<n:0> means a set of components Y<0>, Y<1>, . . . , and Y<n> that have a one-to-one correspondence with the input or output of the signal X<n:0>.

In the following description, a signal BZ refers to an inverse signal of a signal Z. Alternatively, when the signal Z is a control signal, the signal Z has positive logic and the signal BZ has negative logic. That is, an "H" level of the signal Z corresponds to "assert", and an "L" level of the signal Z corresponds to "negate". An "L" level of the signal BZ corresponds to "assert", and an "H" level of the signal BZ corresponds to "negate".

In the following description, a notation A/B means A or B. For example, when X has A/B, C/D, and E, it includes a case where X has A, C, and E and a case where X has B, D, and E.

First Embodiment

A memory system according to a first embodiment will be described with reference to FIGS. 1 to 17. The memory system according to the first embodiment includes, for example, a NAND flash memory as a semiconductor storage device, and a memory controller that controls the NAND flash memory.

Overall Configuration of Memory System

The overall configuration of the memory system according to the first embodiment will be described with reference to FIGS. 1 and 2. The memory system 1 communicates with, for example, an external host device (not illustrated). The memory system 1 stores data received from the host device, and transmits data read from semiconductor storage devices 5 to 8 to the host device.

FIG. 1 is a block diagram illustrating a power supply system for the memory system according to embodiments. As illustrated in FIG. 1, the memory system 1 includes a memory controller 2, a NAND package 3, a power manager 4, and a reference resistor 9. The NAND package 3 includes, for example, a plurality of semiconductor storage devices 5 to 8. The example of FIG. 1 represents a case where four chips are provided in the NAND package 3. In the following description, the semiconductor storage devices 5 to 8 may be referred to as chips A to D, respectively.

The power manager 4 is an IC (integrated circuit) that manages voltages to be supplied to the memory controller 2 and the NAND package 3. For example, the power manager 4 supplies a voltage VCCQ to the memory controller 2 and the NAND package 3. The voltage VCCQ is used as a reference voltage for a voltage used for input/output signals between the memory controller 2 and the NAND package 3. For example, the power manager 4 supplies a voltage VCC to the NAND package 3. The voltage VCC is used as a reference voltage for other voltages used in the NAND package 3.

The NAND package 3 is connected to a voltage VSS via the reference resistor 9. For example, the reference resistor 9 is used to correct the output impedance of each of the semiconductor storage devices 5 to 8 in the NAND package 3. The voltage VSS is the ground voltage and is defined as, for example, the ground (0 V) in the memory system 1.

Figure 2:
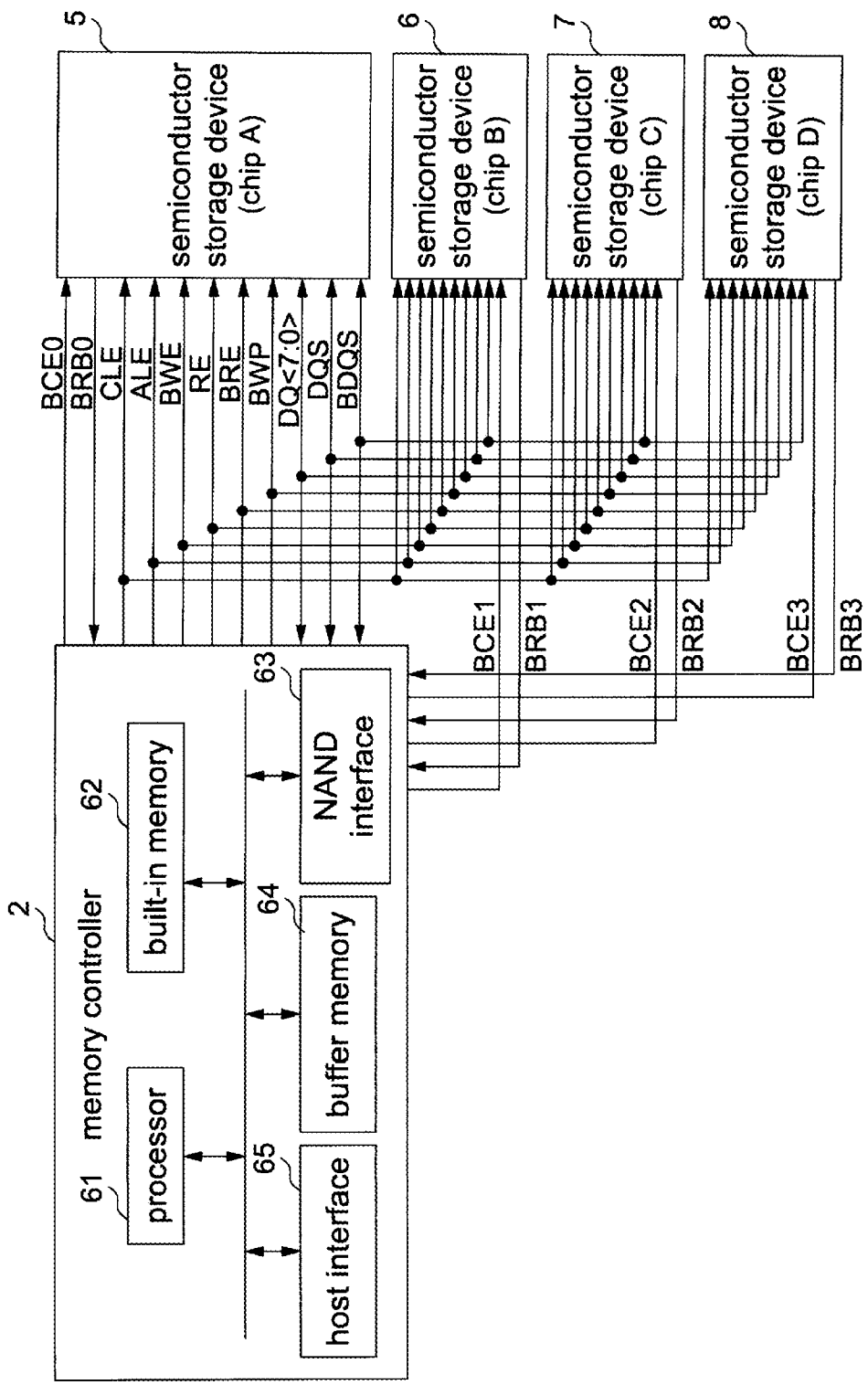
FIG. 2 is a block diagram illustrating signal paths in the memory system according to the embodiments.

FIG. 2 is a block diagram illustrating signal paths in the memory system according to the embodiments. As illustrated in FIG. 2, the memory controller 2 controls the semiconductor storage devices 5 to 8. Specifically, the memory controller 2 writes data in the semiconductor storage devices 5 to 8, and reads data from the semiconductor storage devices 5 to 8. The memory controller 2 is connected to the semiconductor storage devices 5 to 8 by a NAND bus.

Each of the semiconductor storage devices 5 to 8 includes a plurality of memory cells, and stores data in a nonvolatile manner. Each of the semiconductor storage devices 5 to 8 is a semiconductor chip that may be selected, for example, by being supplied with an individual chip enable signal or uniquely identified by being assigned with an individual chip address in advance. Therefore, each of the semiconductor storage devices 5 to 8 may operate independently according to an instruction of the memory controller 2.

The same type of signal is transmitted and received on the NAND bus connected to each of the semiconductor storage devices 5 to 8. The NAND bus includes a plurality of signal lines and transmits/receives signals according to a NAND interface standard. BCE is a chip enable signal and operates with negative logic. BRB is a ready busy signal and operates with negative logic. CLE is a command latch enable signal and operates with positive logic. ALE is an address latch enable signal and operates with positive logic. BWE is a write enable signal and operates with negative logic. RE and BRE are a read enable signal and an inverse of the read enable signal, respectively. RE operates with positive logic. BRE operates with negative logic. For example, RE and/or BRE functions as an output instruction signal. BWP is a write-protect signal and operates with negative logic.

DQ<7:0> is a data signal. The data signal DQ<7:0> is input/output via an input/output terminal (I/O port). For example, signals DQS and BDQS are a data strobe signal and an inverse of the data strobe signal, respectively. DQS and/or BDQS functions as a strobe signal or timing control signal. The strobe signals (DQS/BDQS) are signal pairs that have opposite phases. The strobe signal is a signal that defines the transmission/reception timing of the data signal DQ<7:0>. The signals BCE0 to BCE3 are independently transmitted from the memory controller 2 to the semiconductor storage devices 5 to 8, respectively. The signals BRB0 to BRB3 are independently transmitted from the semiconductor storage devices 5 to 8 to the memory controller 2, respectively. The signals CLE, ALE, BWE, RE, BRE, and BWP are commonly transmitted from the memory controller 2 to the semiconductor storage devices 5 to 8.

The signals BCE0 to BCE3 are signals for enabling the semiconductor storage devices 5 to 8, respectively. The signal CLE notifies the semiconductor storage devices 5 to 8 that the data signal DQ<7:0> transmitted to the semiconductor storage devices 5 to 8 is a command while the signal CLE is at a "H (High)" level. The signal ALE notifies the semiconductor storage devices 5 to 8 that the data signal DQ<7:0> transmitted to the semiconductor storage devices 5 to 8 is an address while the signal ALE is at an "H" level. The signal BWE instructs the semiconductor storage devices 5 to to write the data signal DQ<7:0> transmitted to the semiconductor storage devices 5 to 8 while the signal BWE is at a "L (Low)" level.

The signals RE and BRE instruct the semiconductor storage devices 5 to 8 to output the data signal DQ<7:0> and, for example, controls the operation timings of the semiconductor storage devices 5 to 8 when the data signal DQ<7:0> is output. The signal BWP instructs the semiconductor storage devices 5 to 8 to prohibit data writing and erasing. The signals BRB0 to BRB3 indicate whether the semiconductor storage devices 5 to 8 are in a ready state (a state capable of accepting an instruction from the outside) or a busy state (a state not capable of accepting an instruction from the outside).

The data signal DQ<7:0> is, for example, an 8-bit signal. The data signal DQ<7:0> contains data transmitted/received between the semiconductor storage devices 5 to 8 and the memory controller 2, and includes a command, an address, and data. The signals DQS and BDQS are generated based on, for example, the signals RE and BRE, and control the operation timings of the semiconductor storage devices 5 to 8 related to the data signal DQ<7:0>.

The memory controller 2 includes a processor (CPU: Central Processing Unit) 61, a built-in memory (RAM: Random Access Memory) 62, an NAND interface circuit 63 (NAND interface 63), a buffer memory 64, and a host interface circuit 65 (host interface 65).

The processor 61 controls the operation of the entire memory controller 2. For example, the processor 61 issues a write instruction based on the NAND interface standard to the semiconductor storage devices 5 to 8 in response to a write instruction of data received from the outside. The processor 61 operates similarly in the case of a read operation and an erase operation.

The built-in memory 62 is, for example, a semiconductor memory such as a DRAM (Dynamic RAM) and is used as a work area of the processor 61. The built-in memory 62 stores firmware for managing the semiconductor storage devices 5 to 8, various management tables, and the like.

The NAND interface circuit 63 is connected to the semiconductor storage devices 5 to 8 via the above-described NAND bus, and executes a communication with the semiconductor storage devices 5 to 8. The NAND interface circuit 63 transmits commands, addresses, and write data to the semiconductor storage devices 5 to 8 according to an instruction of the processor 61. The NAND interface circuit 63 receives the status and read data from the semiconductor storage devices 5 to 8.

The buffer memory 64 temporarily stores data and the like received by the memory controller 2 from the semiconductor storage devices 5 to 8 and the outside.

The host interface circuit 65 is connected to an external host device (not illustrated) and executes communication with the host device. The host interface circuit 65 transfers, for example, instructions and data received from the host device to the processor 61 and the buffer memory 64, respectively.

Configuration of Semiconductor Storage Device

An example of the configuration of the semiconductor storage device according to the first embodiment will be described with reference to FIG. 3. The semiconductor storage devices 5 to 8 have, for example, equivalent configuration. Therefore, in the following description, the configuration of the semiconductor storage device 5 among the semiconductor storage devices 5 to 8 will be described, and the description of the configurations of the semiconductor storage devices 6 to 8 will be omitted.

Figure 3:
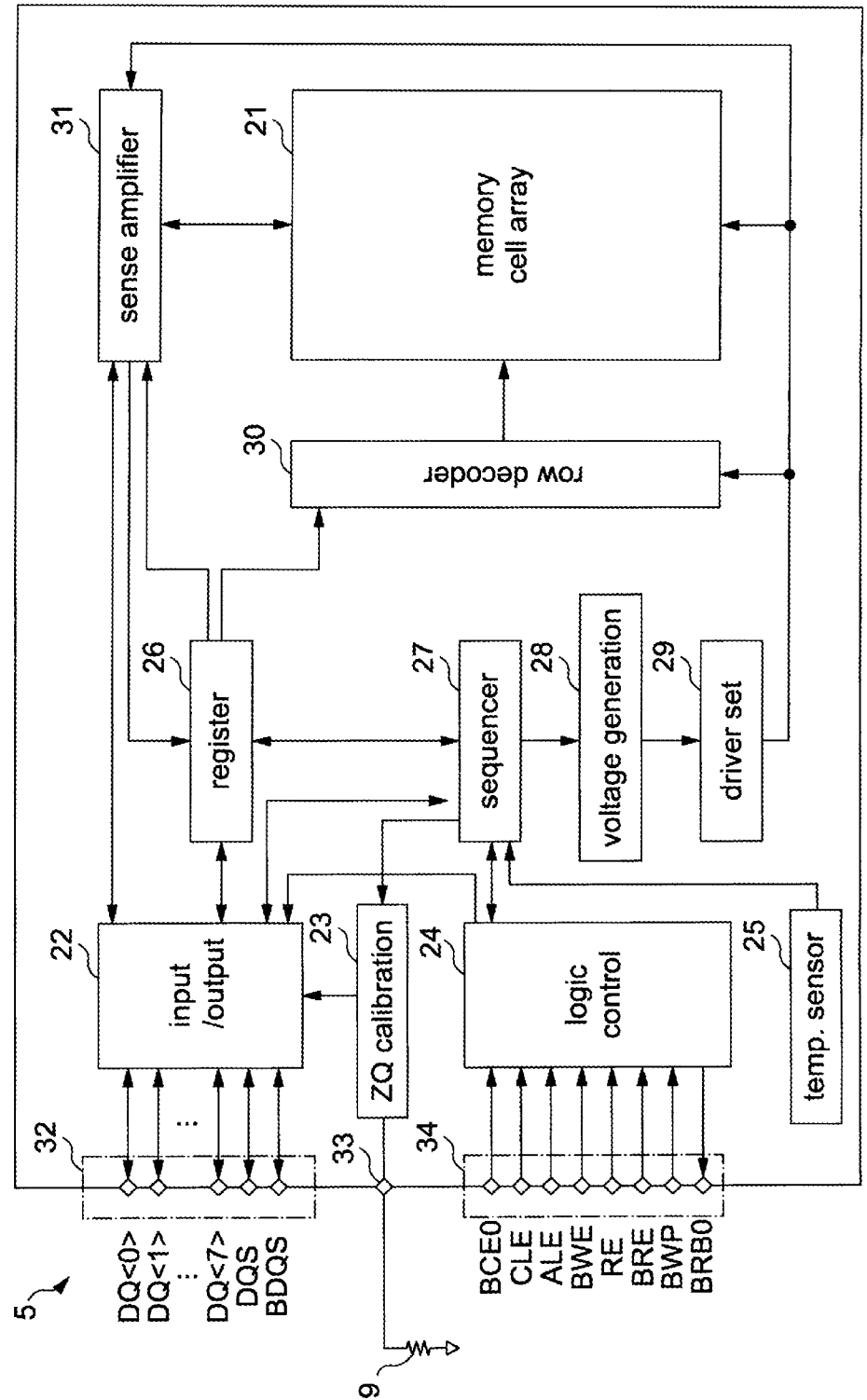
FIG. 3 is a block diagram illustrating the configuration of a semiconductor storage device according to a first embodiment.

As illustrated in FIG. 3, the semiconductor storage device 5 includes a memory cell array 21, an input/output circuit 22 (input/output 22), a ZQ calibration circuit 23 (ZQ calibration 23), a logic control circuit 24 (logic control 24), a temperature sensor 25 (temp. sensor 25), a register 26, a sequencer 27, a voltage generation circuit 28 (voltage generation 28), a driver set 29, a row decoder 30, a sense amplifier 31, an input/output pad group 32, a ZQ calibration pad 33, and a logic control pad group 34.

The memory cell array 21 includes a plurality of non-volatile memory cells (not illustrated) associated with word lines and bit lines.

The input/output circuit 22 transmits/receives the data signal DQ<7:0> to/from the memory controller 2. The input/output circuit 22 transfers the commands and addresses in the data signal DQ<7:0> to the register 26. The input/output circuit 22 transmits/receives write data and read data to/from the sense amplifier 31.

The ZQ calibration circuit 23 calibrates the output impedance of the semiconductor storage device 5 based on the reference resistor 9 via the ZQ calibration pad 33.

The logic control circuit 24 receives the signals BCE0, CLE, ALE, BWE, RE, BRE, and BWP from the memory controller 2. The logic control circuit 24 transfers the signal BRB0 to the memory controller 2 and notifies the state of the semiconductor storage device 5 to the outside.

The temperature sensor 25 has a function of measuring the internal temperature of the semiconductor storage device 5. The temperature sensor 25 sends information about the measured temperature to the sequencer 27. The temperature sensor 25 may be provided at any location in the semiconductor storage device 5 within a range in which a temperature that may be regarded as the temperature of the memory cell array 21 may be measured.

The register 26 stores a command and an address. The register 26 transfers the address to the row decoder 30 and the sense amplifier 31 and also transfers the command to the sequencer 27.

The sequencer 27 receives the command and controls the entire semiconductor storage device 5 according to a sequence based on the received command. The sequencer 27 sends information about the temperature received from the temperature sensor 25 to the memory controller 2 via the input/output circuit 22.

The voltage generation circuit 28 generates voltages required for operations such as writing, reading, and erasing of data based on an instruction from the sequencer 27. The voltage generation circuit 28 supplies the generated voltages to the driver set 29.

The driver set 29 includes a plurality of drivers and supplies the voltages from the voltage generation circuit 28 to the row decoder 30 and the sense amplifier 31 based on the addresses from the register 26. The driver set 29 supplies a voltage to the row decoder 30 based on, for example, a row address in the addresses.

The row decoder 30 receives the row address in the addresses from the register 26, and selects a memory cell of a row based on the row address. The voltage from the driver set 29 is transferred to the selected memory cell of the row via the row decoder 30.

When data is read, the sense amplifier 31 senses the read data read from a memory cell into a bit line and transfers the sensed read data to the input/output circuit 22. When data is written, the sense amplifier 31 transfers the write data written via a bit line to a memory cell. The sense amplifier 31 receives a column address in the addresses from the register 26 and outputs column data based on the column address.

The input/output pad group 32 transfers the data signal DQ<7:0>, the signal DQS, and the signal BDQS received from the memory controller 2 to the input/output circuit 22. The input/output pad group 32 transfers the data signal DQ<7:0> transmitted from the input/output circuit 22 to the outside of the semiconductor storage device 5.

One end of the ZQ calibration pad 33 is connected to the reference resistor 9, and the other end thereof is connected to the ZQ calibration circuit 23.

The logic control pad group 34 transfers the signals BCE0, CLE, ALE, BWE, RE, BRE, and BWP received from the memory controller 2 to the logic control circuit 24. The logic control pad group 34 transfers the signal BRB0 transmitted from the logic control circuit 24 to the outside of the semiconductor storage device 5.

Configuration of Memory Cell Array 21

Figure 4:
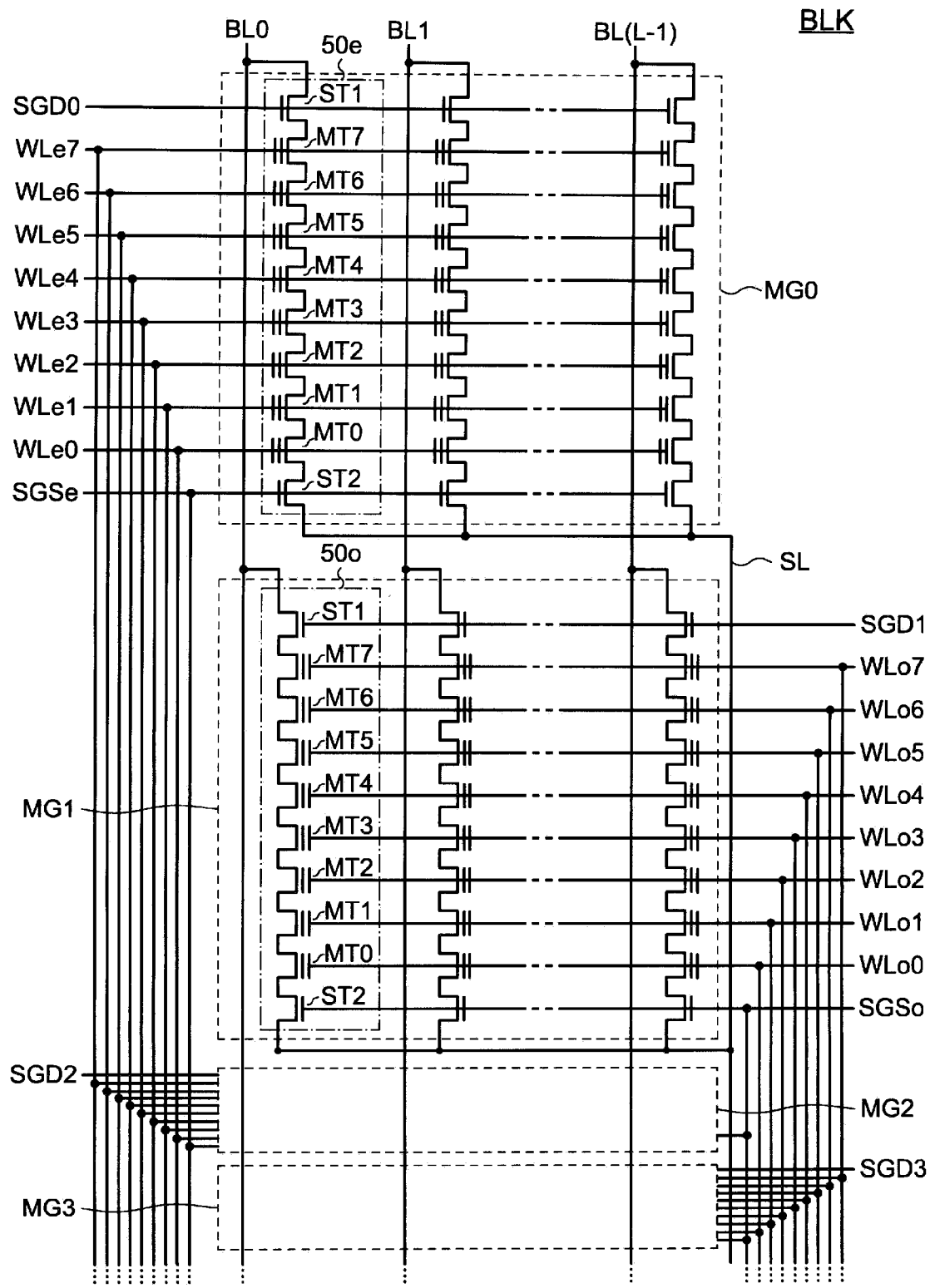
FIG. 4 is a diagram illustrating a circuit configuration of a memory cell array of the semiconductor storage device according to the first embodiment.

The circuit configuration of the memory cell array 21 will be described with reference to FIG. 4. FIG. 4 is an equivalent circuit diagram of a block BLK. As illustrated, the block BLK includes a plurality of memory groups MG (MG0, MG1, MG2, . . . ). Each memory group MG includes a plurality of NAND strings 50. In the following description, a NAND string of the even-numbered memory group MGe (MG0, MG2, MG4, . . . ) is referred to as a NAND string 50*e*, and a NAND string of the odd-numbered memory group MGo (MG1, MG3, MG5, . . . ) is referred to as a NAND string 50*o*.

Each NAND string 50 includes, for example, eight memory cell transistors MT (MT0 to MT7), and select transistors ST1 and ST2. Each memory cell transistor MT includes a control gate and a charge storage layer. The memory cell transistor MT has a threshold voltage. When a voltage equal to or higher than the threshold voltage is applied to the control gate, the memory cell transistor MT is turned ON. When writing is performed on the memory cell transistor MT, that is, when electrons are injected into the charge storage layer of the memory cell transistor MT, the threshold voltage of the memory cell transistor MT changes. The threshold voltage of the memory cell transistor MT in a state where electrons are injected into the charge storage layer is higher than the threshold voltage of the memory cell transistor MT in a state where electrons are not injected into the charge storage layer. The memory cell transistor MT stores data in a nonvolatile manner through a change in the threshold voltage due to the injection of electrons into the charge storage layer. The eight memory cell transistors MT are connected in series between the source of the select transistor ST1 and the drain of the select transistor ST2.

The gates of the select transistors ST1 in the memory groups MG are connected to select gate lines SGD (SGD0, SGD1, . . . ), respectively. The select gate lines SGD are independently controlled by the row decoder 30. The gates of the select transistors ST2 in the even-numbered memory groups MGe (MG0, MG2, . . . ) are connected in common to the select gate line SGSe. The gates of the select transistors ST2 in the odd-numbered memory groups MGo (MG1, MG3, . . . ) are connected in common to the select gate line SGSo. The select gate lines SGse and SGSo may be connected in common or may be independently controllable.

The control gates of the memory cell transistors MT (MT0 to MT7) in the memory group MGe in the same block BLK are connected in common to word lines WLe (WLe0 to WLe7), respectively. Meanwhile, the control gates of the memory cell transistors MT (MT0 to MT7) in the memory group MGo are connected in common to word lines WLo (WLo0 to WLo7), respectively. The word lines WLe and WLo are independently controlled by the row decoder 30.

The block BLK is, for example, a unit of data erasing. That is, data stored by the memory cell transistors MT in the same block BLK are collectively erased. The threshold voltage of a memory cell transistor MT in the erased state is lower than the threshold voltage of a memory cell transistor MT in a written state.

In the memory cell array 21, the drains of the select transistors ST1 of the NAND string 50 provided in the same column are connected in common to bit lines BL (BL0 to BL(L-1), where (L-1) is a natural number of 2 or more). That is, the bit lines BL are connected in common to the NAND string 50 across the plurality of memory groups MG. In the memory cell array 21, the sources of the plurality of select transistors ST2 are connected in common to a source line SL.

That is, the memory group MG includes a plurality of NAND strings 50 connected to different bit lines BL and connected to the same select gate line SGD. The block BLK includes a plurality of memory groups MG having a common word line WL. The memory cell array 21 includes a plurality of blocks BLK having a common bit line BL. In the memory cell array 21, the select gate line SGS, the word line WL, and the select gate line SGD are stacked on a semiconductor substrate, so that the memory cell transistors MT are stacked in three dimensions.

Plane Layout of Memory Cell Array

Figure 5:
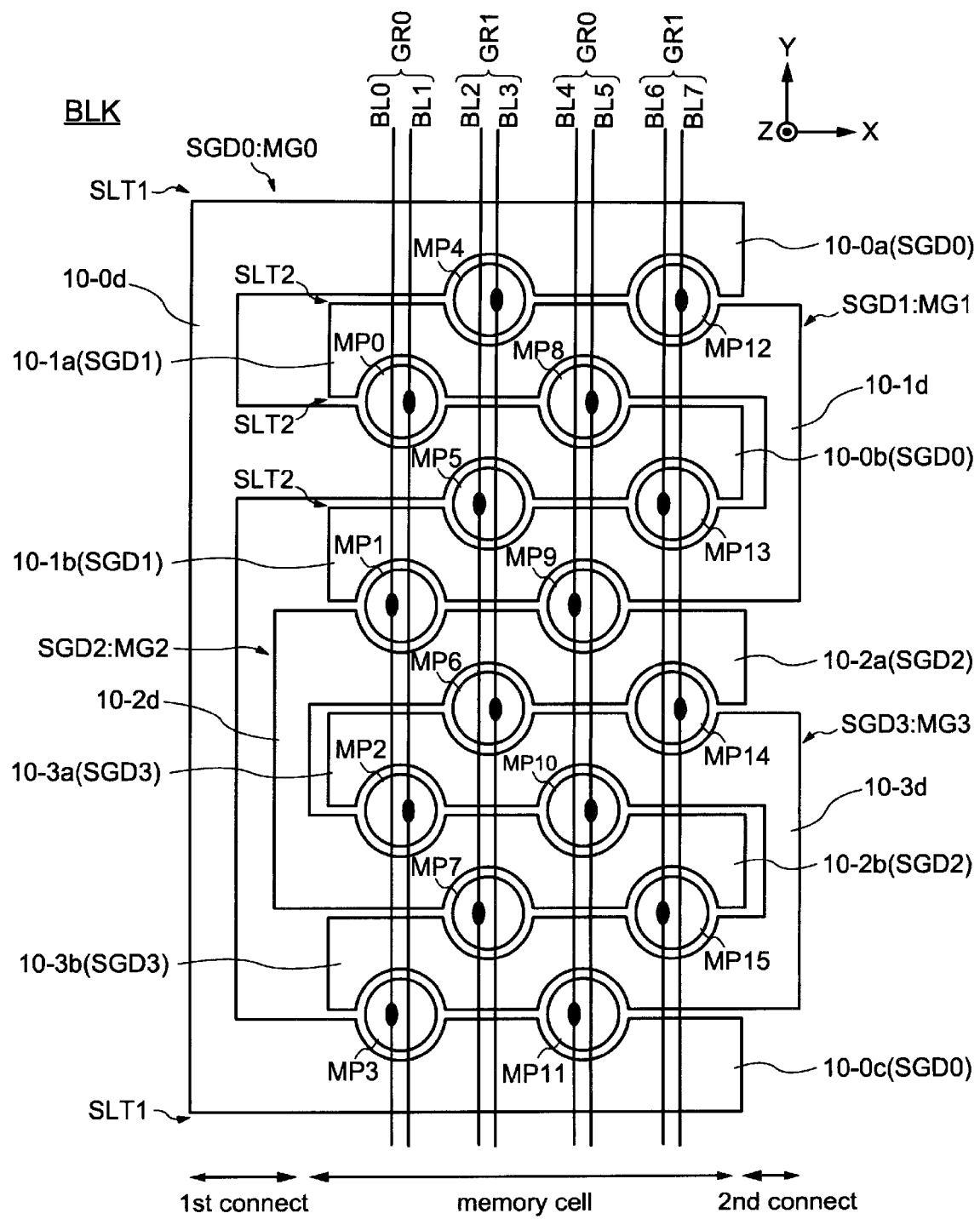
FIG. 5 is a diagram illustrating the layout of select gate lines, bit lines, and memory pillars in the semiconductor storage device according to the first embodiment.

The plane configuration of the memory cell array 21 will be described with reference to FIG. 5. FIG. 5 illustrates the plane layout of select gate lines SGD of a certain block BLK in a semiconductor substrate plane (XY plane). In the present embodiment, description will be made on a case where four select gate lines SGD are provided in one block BLK.

As illustrated in FIG. 5, wiring layers 10-0*a*, 10-0*b*, and 10-0*c* having a long length in the X direction are connected by a first connection portion 10-0*d* having a long length in the Y direction. The two wiring layers 10-0*a* and 10-0*c* are provided at both ends in the Y direction. The wiring layers 10-0*a* and 10-0*b* are adjacent to each other in the Y direction with another wiring layer (wiring layer 10-1*a*) interposed therebetween. The first connection portion 10-0*d* is provided at one end in the X direction. The three wiring layers 10-0*a*, 10-0*b*, and 10-0*c* function as the select gate line SGD0.

The wiring layers 10-1*a* and 10-1*b* having a long length in the X direction are connected by a second connection portion 10-1*d* having a long length in the Y direction. The wiring layer 10-1*a* is provided between the wiring layers 10-0*a* and 10-0*b*. The wiring layer 10-1*b* is provided between the wiring layer 10-0*b* and another wiring layer (wiring layer 10-2*a*). The second connection portion 10-1*d* is provided at the other end opposite to the first connection portion 10-0*d* in the X direction. The two wiring layers 10-1*a* and 10-1*b* function as the select gate line SGD1.

The wiring layers 10-2*a* and 10-2*b* having a long length in the X direction are connected by a first connection portion 10-2*d* having a long length in the Y direction. Similarly, the wiring layers 10-3*a* and 10-3*b* having a long length in the X direction are connected by a second connection portion 10-3*d* having a long length in the Y direction. The wiring layer 10-2*a* is provided between the wiring layer 10-1*b* and the wiring layer 10-3*a*. The wiring layer 10-3*a* is provided between the wiring layer 10-2*a* and the wiring layer 10-2*b*. The wiring layer 10-2*b* is provided between the wiring layer 10-3*a* and the wiring layer 10-3*b*. The wiring layer 10-3*b* is provided between the wiring layer 10-2*b* and the wiring layer 10-0*c*. The first connection portion 10-2*d* is provided at one end on the same side as the first connection portion 10-0*d* in the X direction. The second connection portion 10-3*d* is provided at the other end opposite to the first connection portion 10-0*d* in the X direction. The two wiring layers 10-2*a* and 10-2*b* function as the select gate line SGD2. The two wiring layers 10-3*a* and 10-3*b* function as the select gate line SGD3.

A configuration in which the wiring layers are connected by the first connection portion 10-0*d* and 10-2*d* or the second connection portion 10-1*d* and 10-3*d* is exemplified in the present embodiment, but the present embodiment is limited to this configuration. For example, the wiring layers may be independent of each other, the same voltage may be supplied to the wiring layers 10-0*a*, 10-0*b*, and 10-0*c*, the same voltage may be supplied to the wiring layers 10-1*a* and 10-1*b*, the same voltage may be supplied to the wiring layers 10-2*a* and 10-2*b*, and the same voltage may be supplied to the wiring layers 10-3*a* and 10-3*b*.

A group including memory pillars MP adjacent to the wiring layers 10-0*a*, 10-0*b*, and 10-0*c* will be referred as a memory group MG0. A group including memory pillars MP adjacent to the wiring layers 10-1*a* and 10-1*b* will be referred to as a memory group MG1. A group including memory pillars MP adjacent to the wiring layers 10-2*a* and 10-2*b* will be referred to as a memory group MG2. A group including memory pillars MP adjacent to the wiring layers 10-3*a* and 10-3*b* will be referred to as a memory group MG3.

The wiring layers 10 adjacent to each other in the Y direction in the block BLK are insulated. A region that insulates the adjacent wiring layers 10 will be referred to as a slit SLT2. In the slit SLT2, for example, a region from the semiconductor substrate plane to at least a layer where the wiring layers 10 are provided is buried with an insulating layer. In the memory cell array 21, a plurality of blocks BLK illustrated in FIG. 5 are arranged, for example, in the Y direction. The blocks BLK adjacent to each other in the Y direction are also insulated in the same manner as described above. A region that insulates the adjacent blocks BLK will be referred to as a slit SLT1. The slit SLT1 has the same configuration as the SLT2.

A plurality of memory pillars MP (MP0 to MP15) is provided between the wiring layers 10 adjacent to each other in the Y direction. Each of the plurality of memory pillars MP has a long length in the Z direction. The Z direction is a direction orthogonal to the XY direction, that is, a direction orthogonal to the semiconductor substrate plane. The plurality of memory pillars MP are provided in a memory cell unit.

Specifically, the memory pillars MP4 and MP12 are provided between the wiring layers 10-0*a* and 10-1*a*. The memory pillars MP0 and MP8 are provided between the wiring layers 10-1*a* and 10-0*b*. The memory pillars MP5 and MP13 are provided between the wiring layers 10-0*b* and 10-1*b*. The memory pillars MP1 and MP9 are provided between the wiring layers 10-1*b* and 10-2*a*. The memory pillars MP6 and MP14 are provided between the wiring layers 10-2*a* and 10-3*a*. The memory pillars MP2 and MP10 are provided between the wiring layers 10-3*a* and 10-2*b*. The memory pillars MP7 and MP15 are provided between the wiring layers 10-2*b* and 10-3*b*. The memory pillars MP3 and MP11 are provided between the wiring layers 10-3*b* and 10-0*c*.

Each memory pillar MP is a structure that forms select transistors ST1 and ST2 and memory cell transistors MT. The detailed structure of the memory pillar MP will be described later.

The memory pillars MP0 to MP3 are arranged along the Y direction. The memory pillars MP8 to MP11 are arranged along the Y direction at positions adjacent to the memory pillars MP0 to MP3 in the X direction. That is, the memory pillars MP0 to MP3 and the memory pillars MP8 to MP11 are arranged in parallel.

The memory pillars MP4 to MP7 and the memory pillars MP12 to MP15 are arranged along the Y direction. The memory pillars MP4 to MP7 are located between the memory pillars MP0 to MP3 and the memory pillars MP8 to MP11 in the X direction. The memory pillars MP12 to MP15 are arranged along the Y direction at positions adjacent to the memory pillars MP4 to MP7 in the X direction. That is, the memory pillars MP4 to MP7 and the memory pillars MP12 to MP15 are arranged in parallel.

Two bit lines BL0 and BL1 are provided above the memory pillars MP0 to MP3. The bit line BL0 is connected in common to the memory pillars MP1 and MP3. The bit line BL1 is connected in common to the memory pillars MP0 and MP2. Two bit lines BL2 and BL3 are provided above the memory pillars MP4 to MP7. The bit line BL2 is connected in common to the memory pillars MP5 and MP7. The bit line BL3 is connected in common to the memory pillars MP4 and MP6.

Two bit lines BL4 and BL5 are provided above the memory pillars MP8 to MP11. The bit line BL4 is connected in common to the memory pillars MP9 and MP11. The bit line BL5 is connected in common to the memory pillars MP8 and MP10. Two bit lines BL6 and BL7 are provided above the memory pillars MP12 to MP15. The bit line BL6 is connected in common to the memory pillars MP13 and MP15. The bit line BL7 is connected in common to the memory pillars MP12 and MP14.

In the present embodiment, the memory pillars MP0 to MP3 and MP8 to MP11 in the Y direction are disposed at positions shifted from the memory pillars MP4 to MP7 and MP12 to MP15 by ½ of a distance between the memory pillars MP. Here, the memory pillars MP0 to MP3 and MP8 to MP11 are classified into a group GR0, and the memory pillars MP4 to MP7 and MP12 to MP15 are classified into a group GR1.

As described above, the memory pillars MP are provided between two wiring layers 10 adjacent to each other in the Y direction so as to be buried in a portion of one of the slits SLT2, and one slit SLT2 exists between memory pillars MP adjacent to each other in the Y direction. In the Y direction, the slit SLT2 in which the memory pillars MP belonging to the group GR0 is buried is located between two memory pillars MP belonging to the group GR1. Similarly, in the Y direction, the slit SLT2 in which the memory pillars MP belonging to the group GR1 is buried is located between two memory pillars MP belonging to the group GR0.

The memory pillars MP are not provided in a region between the wiring layers 10-0*a* and 10-0*c* adjacent to each other with the slit SLT1 in between. However, from the viewpoint of process stability, a dummy memory pillar MP that is not connected to the bit lines BL may be provided in the region.

Figure 6:
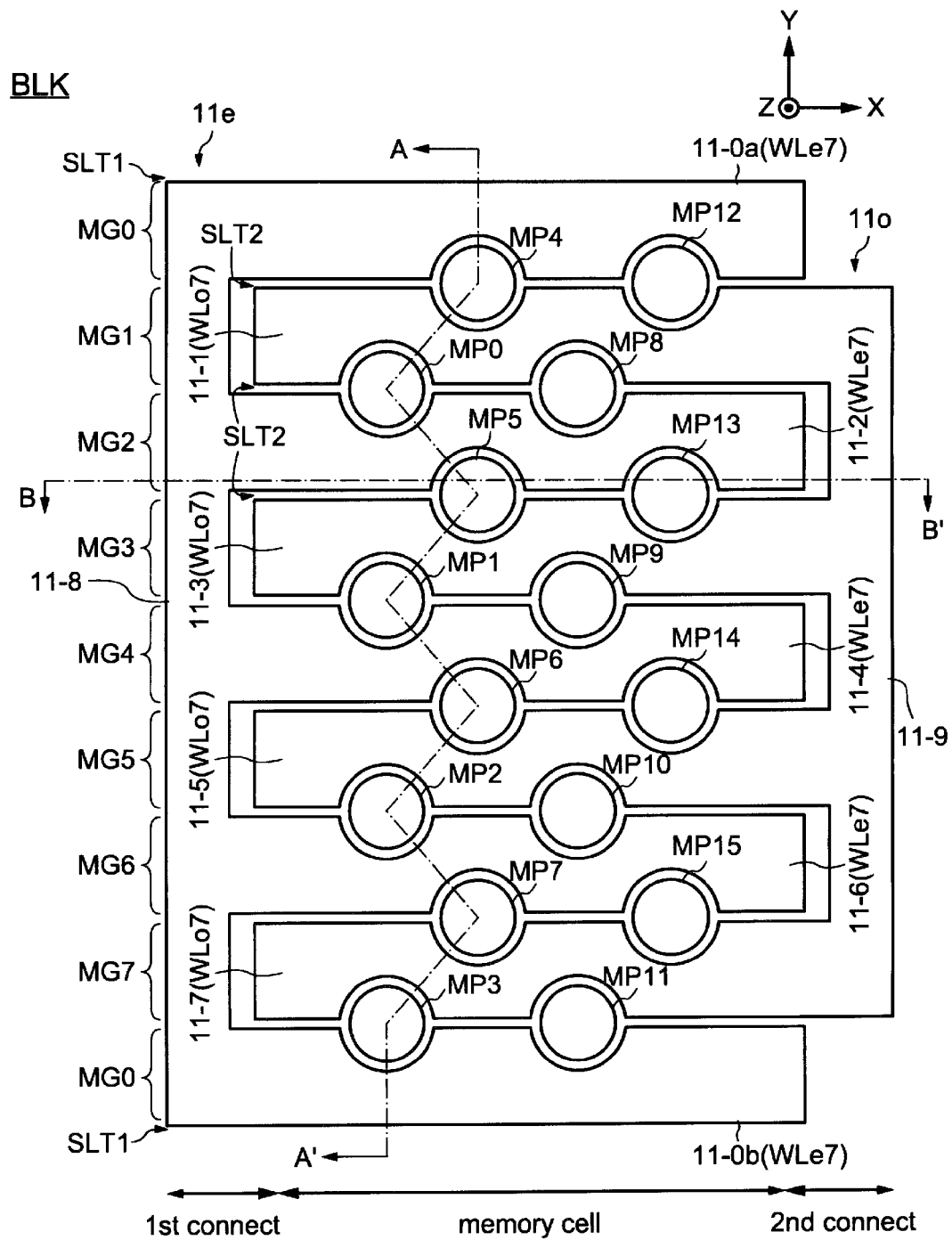
FIG. 6 is a diagram illustrating the layout of word lines and memory pillars in the semiconductor storage device according to the first embodiment.

FIG. 6 illustrates the plane layout of word lines WL in the XY plane, as in FIG. 5. FIG. 6 corresponds to a region for one block of FIG. 5 and is the layout of wiring layers 11 provided below the wiring layers 10 described with reference to FIG. 5.

As illustrated in FIG. 6, nine wiring layers 11 (11-0*a*, 11-0*b*, and 11-1 to 11-7) extending in the X direction are arranged along the Y direction. The wiring layers 11-0*a*, 11-0*b*, and 11-1 to 11-7 are provided below the wiring layers 10-0*a*, 10-0*b*, 10-0*c*, 10-1*a*, 10-1*b*, 10-2*a*, 10-2*b*, 10-3*a*, and 10-3*b* via an insulating layer.

Each wiring layer 11 functions as a word line WL7. The other word lines WL0 to WL6 also have the same configuration and function as the word lines WL7. In the example of FIG. 6, the wiring layers 11-0*a*, 11-2, 11-4, 11-6, and 11-0*b* function as a word line WLe7. These wiring layers 11-0*a*, 11-2, 11-4, 11-6, and 11-0*b* are connected by a first connection portion 11-8 having a long length in the Y direction. The first connection portion 11-8 is provided at one end in the X direction. The wiring layers 11-0*a*, 11-2, 11-4, 11-6, and 11-0*b* are connected to the row decoder 30 via the first connection portion 11-8. The first connection portion 11-8 and the wiring layers 11-0a, 11-2, 11-4, 11-6, and 11-0b may be collectively referred to as a wiring layer 11e.

The wiring layers 11-1, 11-3, 11-5, and 11-7 function as a word line WLo7. These wiring layers 11-1, 11-3, 11-5, and 11-7 are connected by a second connection portion 11-9 having a long length in the Y direction. The second connection portion 11-9 is provided at the other end opposite to the first connection portion 11-8 in the X direction. The wiring layers 11-1, 11-3, 11-5, and 11-7 are connected to the row decoder via the second connection portion 11-9. The second connection portion 11-9 and the wiring layers 11-1, 11-3, 11-5, and 11-7 may be collectively referred to as a wiring layer 11o.

A memory cell unit is provided between the first connection portion 11-8 and the second connection portion 11-9. In the memory cell unit, the wiring layers 11 adjacent to each other in the Y direction are separated from each other by the slit SLT2 described with reference to FIG. 5. The wiring layers 11 between the blocks BLK adjacent to each other in the Y direction is also separated from each other by the slit SLT1 as described in FIG. 5. In the memory cell unit, the memory pillars MP0 to MP15 are provided as in FIG. 5.

The select gate line SGS and the word lines WL0 to WL6 have the same configuration as the word line WL7 of FIG. 6.

Cross-Sectional Structure of Memory Cell Array

Figure 7:
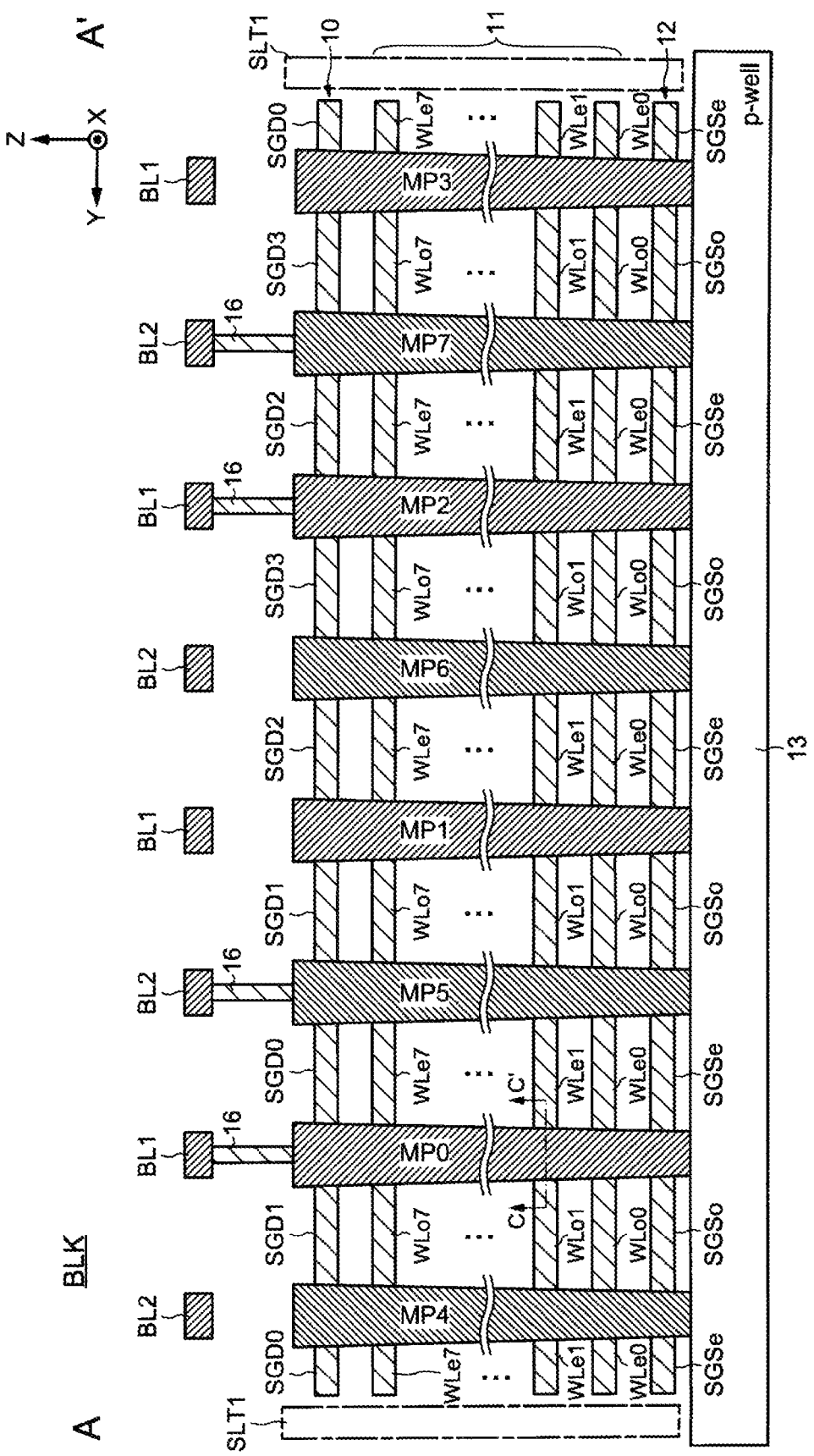
FIG. 7 is a cross-sectional view of the semiconductor storage device taken along line A-A' in FIGS. 5 and 6.

The cross-sectional structure of the memory cell array 21 will be described with reference to FIG. 7. FIG. 7 is a cross-sectional view of the semiconductor storage device taken along line A-A' in FIGS. 5 and 6.

As illustrated in FIG. 7, a wiring layer 12 that functions as a select gate wire SGS is provided above a p-type well region of a semiconductor substrate 13. Eight wiring layers 11 that function as word lines WL0 to WL7 are stacked above the wiring layer 12 along the Z direction. The plane layout of the wiring layers 11 and 12 is the same as the layout illustrated in FIG. 6. A wiring layer 10 that functions as a select gate wire SGD is provided above the wiring layer 11. The planar layout of the wiring layer 10 corresponds to the layout illustrated in FIG. 5.

The wiring layer 12 functions as a select gate line SGSo or a select gate line SGSe. The select gate lines SGSo and SGSe are arranged alternately in the Y direction. A memory pillar MP is provided between the select gate lines SGSo and SGSe adjacent to each other in the Y direction.

The wiring layer 11 functions as a word line WLo or a word line WLe. The word lines WLo and WLe are arranged alternately in the Y direction. A memory pillar MP is provided between the word lines WLo and WLe adjacent to each other in the Y direction. Memory cells to be described later are provided between the memory pillar MP and the word line WLo and between the memory pillar MP and the word line WLe.

A slit SLT1 is provided between the blocks BLK adjacent to each other in the Y direction. As described above, an insulating layer is provided in the slit SLT1. However, a contact plug or the like for supplying a voltage to a region provided in the semiconductor substrate 13 may be provided in the slit SLT1. For example, a contact plug or a groove-shaped conductor for connecting the source of the select transistor ST2 to a source line may be provided in the slit SLT1.

Bit lines BL1 and BL2 are provided on the memory pillar MP. A contact plug 16 for connecting each memory pillar MP and the bit line BL is provided between the memory pillar MP0 and the bit line BL1 and between the memory pillar MP2 and the bit line BL1. Similarly, a contact plug 16 for connecting each memory pillar MP and the bit line BL is provided between the memory pillar MP5 and the bit line BL2 and between the memory pillar MP7 and the bit line BL2. The other memory pillars MP are connected to the bit line BL1 or the bit line BL2 via the contact plug 16 in a region that is not illustrated in the cross section of FIG. 7.

Figure 8:
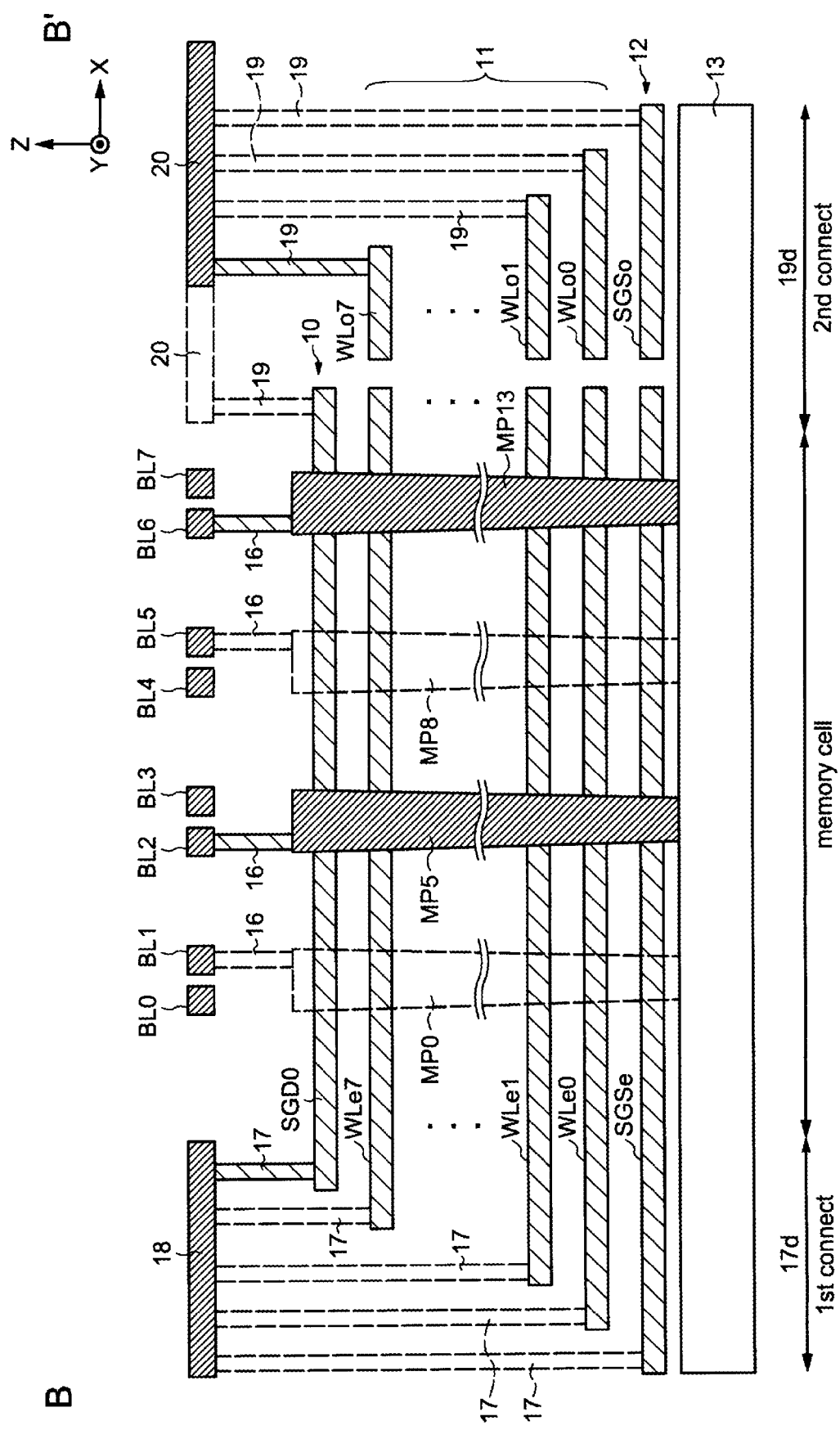
FIG. 8 is a cross-sectional view of the semiconductor storage device taken along line B-B' in FIGS. 5 and 6.

FIG. 8 is a cross-sectional view of the semiconductor storage device taken along line B-B' in FIGS. 5 and 6. As described with reference to FIG. 7, the wiring layers 12, 11, and 10 are provided in this order above the semiconductor substrate 13. In FIG. 8, the configuration existing in the depth direction of the B-B' cross-sectional view is depicted by dotted lines.

The wiring layers 11 and 12 are formed in a stepped shape in a first connection region 17d. That is, when viewed in the XY plane, each of the ends of the eight wiring layers 11 and the upper surface of the end of the wiring layer 12 are exposed in the first connection region 17d. Contact plugs 17 are provided on the wiring layers 11 and 12 exposed in the first connection region 17d. The contact plugs 17 are connected to a metal wiring layer 18. The wiring layers 10 to 12 functioning as the even-numbered select gate lines SGD0, SGD2, SGD4, and SGD6, the even-numbered word lines WLe, and the even-numbered select gate lines SGSe are electrically connected to the row decoder 30 via the metal wiring layer 18.

The wiring layers 11 and 12 are formed in a stepped shape in a second connection region 19d, as described above. That is, when viewed in the XY plane, each of the ends of the eight wiring layer 11 and the upper surface of the end of the wiring layer 12 are exposed in the second connection region 19d. Contact plugs 19 are provided on the wiring layers 11 and 12 exposed in the second connection region 19d. The contact plugs 19 are connected to a metal wiring layer 20. The wiring layers 11 and 12 functioning as the odd-numbered select gate lines SGD1, SGD3, SGD5, and SGD7, the odd-numbered word lines WLo, and the odd-numbered select gate lines SGSo are electrically connected to the row decoder 30 via the metal wiring layer 20.

The wiring layer 10 may be electrically connected to the row decoder 30 via the second connection region 19d, instead of the first connection region 17d, and may be electrically connected to the row decoder 30 via both the first connection region 17d and the second connection region 19d.

Structure of Memory Pillar and Memory Cell Transistor

The structure of a memory pillar MP and a memory cell transistor MT will be described with reference to FIGS. 9 and 10.

First Example

The configuration of a memory pillar MP and a memory cell transistor MT according to a first example will be described with reference to FIGS. 9 and 10. FIG. 9 is a cross-sectional view of the memory cell taken along line C-C' in FIG. 7. FIG. 10 is a cross-sectional view of the memory cell taken along line D-D' in FIG. 9. The first example represents a floating gate type memory cell transistor MT in which a conductive layer is used as a charge storage layer of the memory cell transistor MT.

Figure 9:
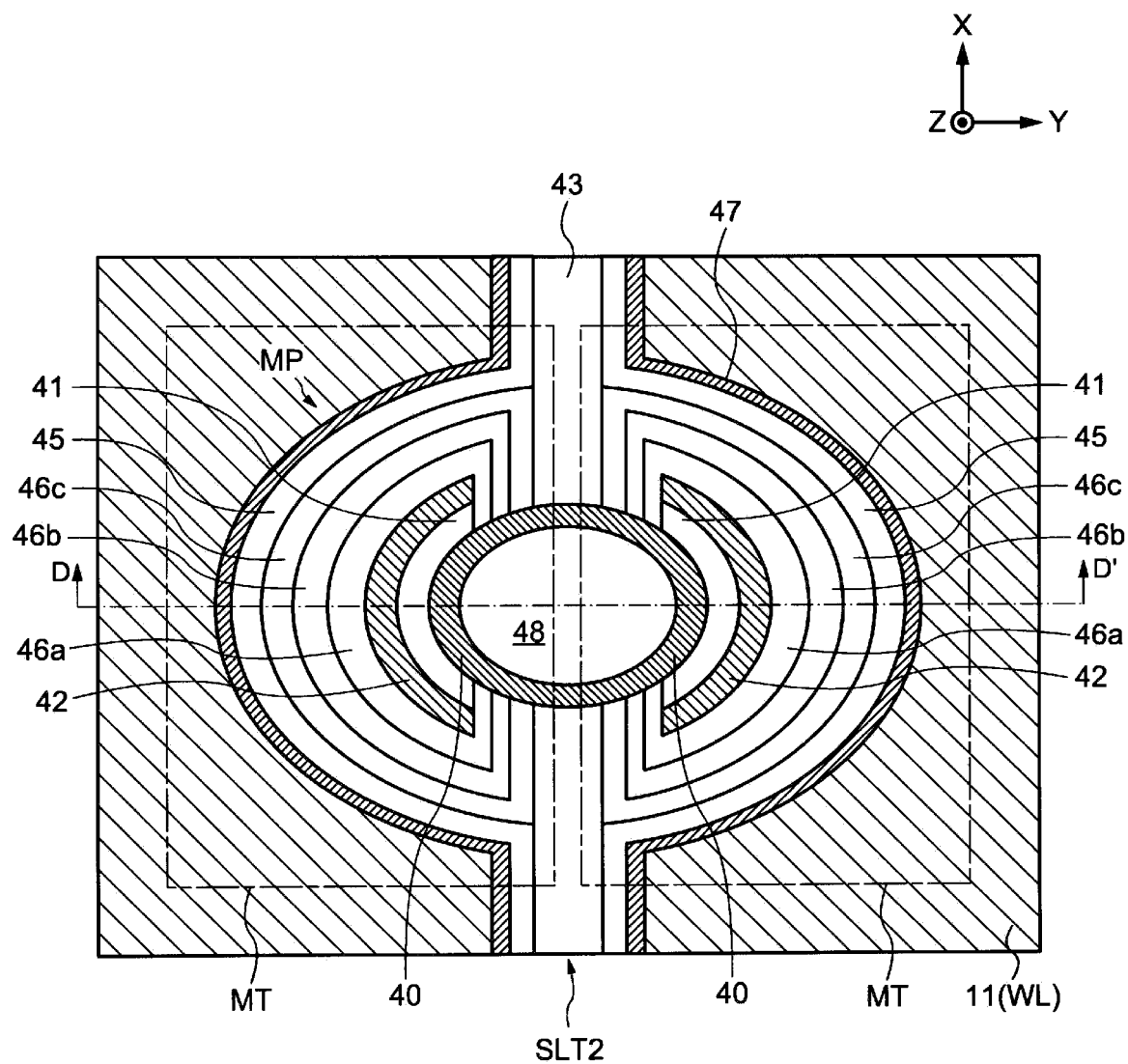
FIG. 9 is a cross-sectional view of a memory cell taken along line C-C' in FIG. 7.
Figure 10:
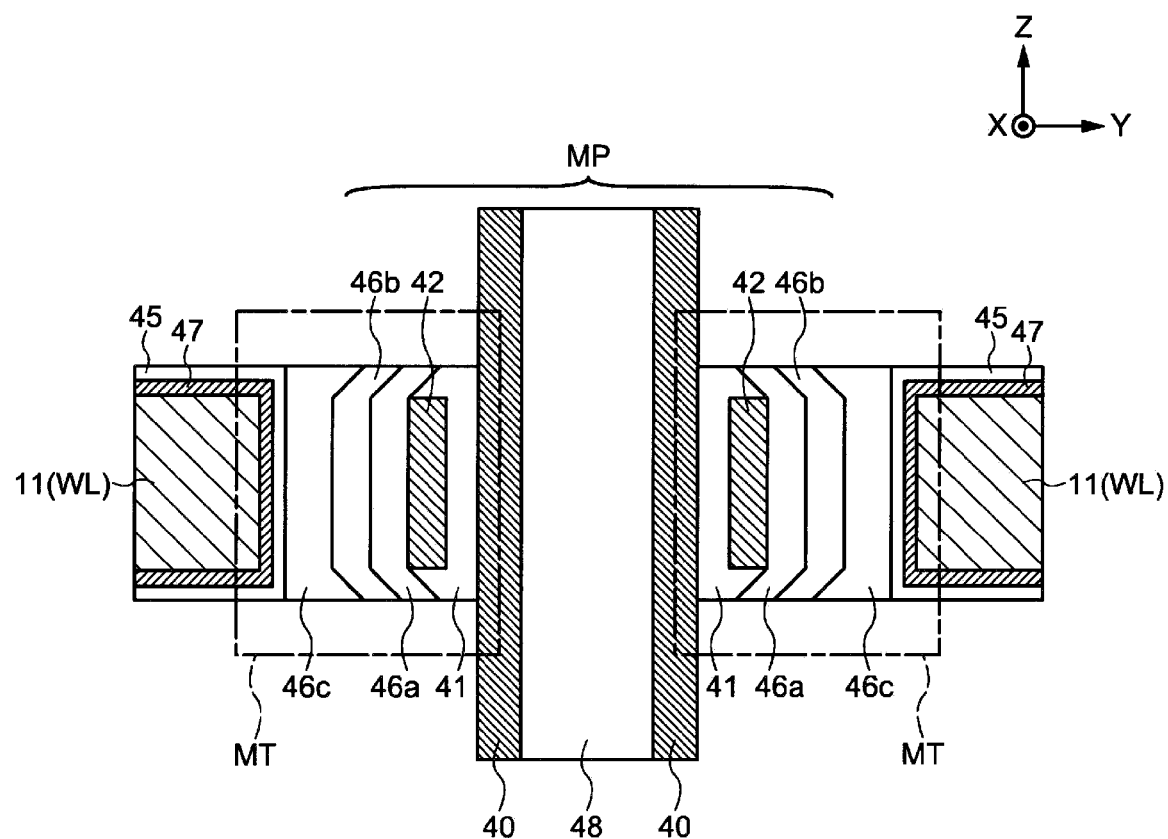
FIG. 10 is a cross-sectional view of a memory cell taken along line D-D' in FIG. 9.

As illustrated in FIGS. 9 and 10, the memory pillar MP includes insulating layers 48 and 43, a semiconductor layer 40, an insulating layer 41, a conductive layer 42, and insulating layers 46a to 46c, all of which extend along the Z direction. The insulating layer 48 is, for example, a silicon oxide layer. The semiconductor layer 40 surrounds the insulating layer 48. The semiconductor layer 40 is, for example, a polycrystalline silicon layer. The semiconductor layer 40 functions as a channel of the memory cell transistor MT. The semiconductor layer 40 is continuously provided between two memory cell transistors MT in one memory pillar MP, and is not separated for each memory cell transistor MT.

As described above, the semiconductor layer 40 is continuous between the two memory cell transistors MT that face each other. Therefore, channels formed in the two memory cell transistors MT share a portion of the memory pillar MP. Specifically, in FIG. 9, in the left memory cell transistor MT (first memory cell) and the right memory cell transistor MT (second memory cell) facing each other, a channel (first channel) formed by the first memory cell and a channel (second channel) formed by the second memory cell share a portion of the memory pillar MP. Here, the fact that the two channels share a portion of the memory pillar MP means that the two channels are formed in the same memory pillar MP and partially overlap with each other. In the above configuration, it may be said that the two memory cell transistors MT share a channel or the two memory cell transistors MT face each other.

The insulating layer 41 is provided around the semiconductor layer 40, and functions as a gate insulating layer of each memory cell transistor MT. The insulating layer 41 is separated into two regions in the XY plane illustrated in FIG. 9, each of which functions as a gate insulating layer of two memory cell transistors MT in one memory pillar MP. The insulating layer 41 has, for example, a stacked structure of a silicon oxide layer and a silicon nitride layer. The conductive layer 42 is provided around the insulating layer 41, and is separated by the insulating layer 43 into two regions along the Y direction. The conductive layer 42 is, for example, a polycrystalline silicon layer having conductivity. The two regions into which the conductive layer 42 is separated function as charge storage layers of the above two memory cell transistors MT, respectively.

The insulating layer 43 is, for example, a silicon oxide layer. The insulating layers 46a, 46b, and 46c are sequentially provided around the conductive layer 42. The insulating layers 46a and 46c are, for example, silicon oxide layers. The insulating layer 46b is, for example, a silicon nitride layer. These insulating layers function as block insulating layers of the memory cell transistor MT. Each of the insulating layers 46a, 46b, and 46c is also separated into two regions along the Y direction, and the insulating layer 43 is provided between the two regions. The insulating layer 43 is buried in the slit SLT2. The insulating layer 43 is, for example, a silicon oxide layer.

For example, an AlO layer 45 is provided around the memory pillar MP having the above configuration. For example, a barrier metal layer (TiN layer or the like) 47 is formed around the AlO layer 45. A wiring layer 11 functioning as a word line WL is provided around the barrier metal layer 47. The wiring layer 11 is made of, for example, tungsten.

With the above configuration, two memory cell transistors MT are provided in one memory pillar MP along the Y direction. The select transistors ST1 and ST2 also have the same configuration as described above. An insulating layer (not illustrated) is provided between memory cell transistors adjacent to each other in the Z direction, and the conductive layer 42 is insulated for each individual memory cell transistor by the insulating layer and the insulating layers 43 and 46.

Second Example

Figure 11:
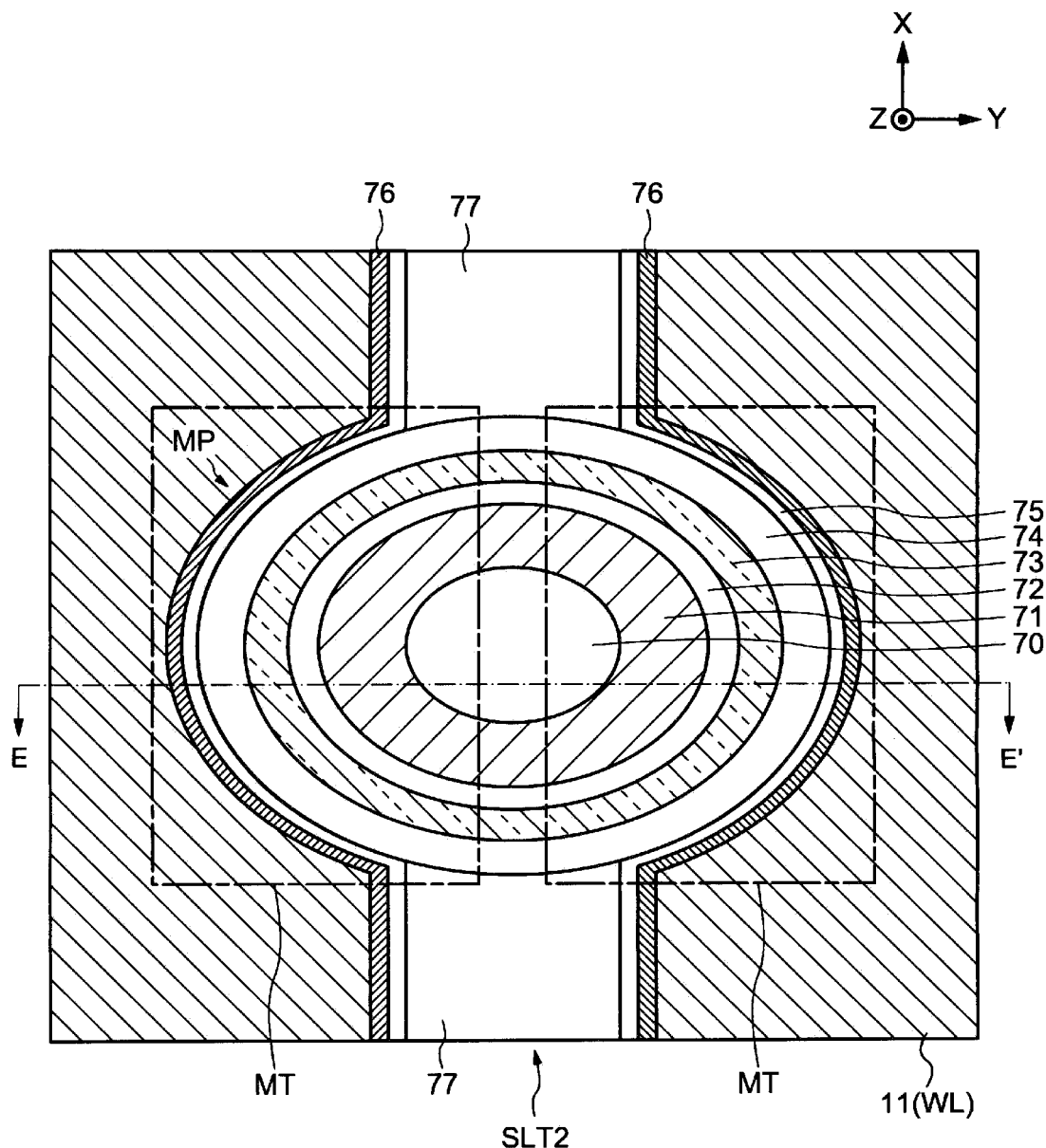
FIG. 11 is a modification of the memory cell illustrated in FIG. 9.
Figure 12:
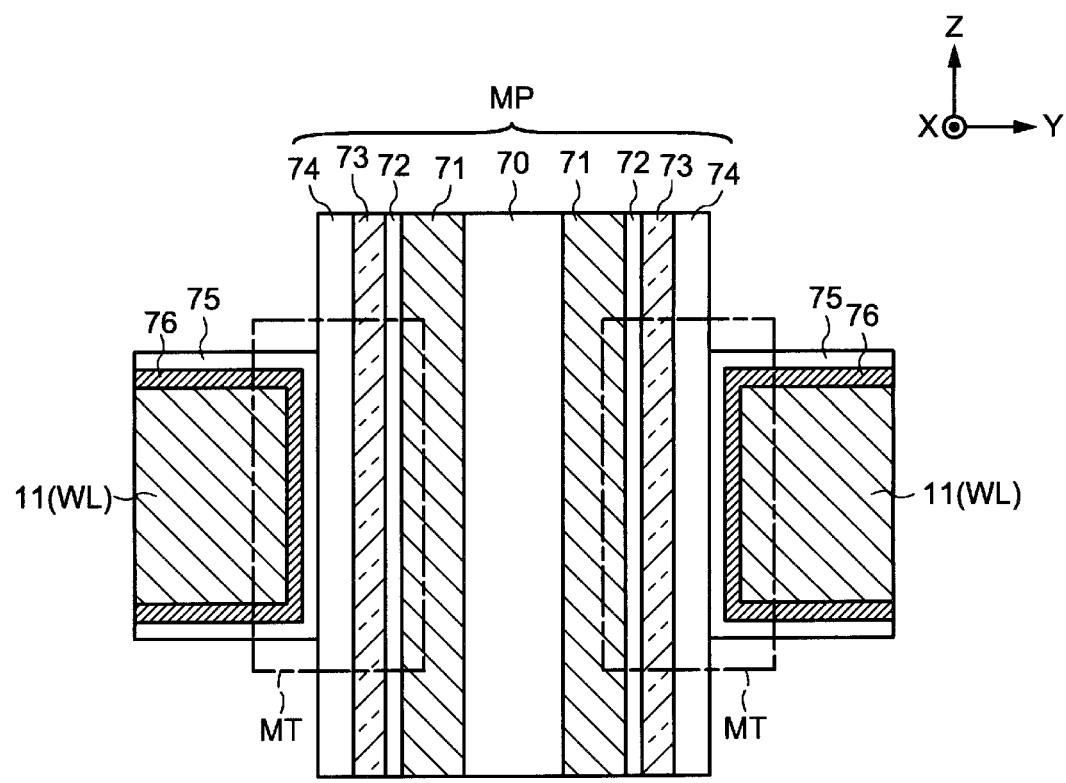
FIG. 12 is a cross-sectional view of a memory cell taken along line E-E' in FIG. 11.

The configuration of a memory pillar MP and a memory cell transistor MT according to a second example will be described with reference to FIGS. 11 and 12. FIG. 11 illustrates a modification of the memory cell illustrated in FIG. 9. FIG. 12 is a cross-sectional view of a memory cell taken along line E-E' in FIG. 11. The second example represents a MONOS type memory cell transistor MT in which an insulating layer is used for a charge storage layer of the memory cell transistor MT.

As illustrated in FIGS. 11 and 12, the memory pillar MP includes an insulating layer 70, a semiconductor layer 71, and insulating layers 72 to 74 provided along the Z direction. The insulating layer 70 is, for example, a silicon oxide layer. The semiconductor layer 71 surrounds the insulating layer 70. The semiconductor layer 71 functions as a channel of the memory cell transistor MT. The semiconductor layer 71 is, for example, a polycrystalline silicon layer. The semiconductor layer 71 is continuously provided between two memory cell transistors MT in one memory pillar MP. Therefore, channels formed in the two memory cell transistors MT share a portion of the memory pillar MP.

The insulating layer 72 surrounds the semiconductor layer 71, and functions as a gate insulating layer of the memory cell transistor MT. The insulating layer 72 has, for example, a stacked structure of a silicon oxide layer and a silicon nitride layer. The insulating layer 73 surrounds the semiconductor layer 71, and functions as a charge storage layer of the memory cell transistor MT. The insulating layer 73 is, for example, a silicon nitride layer. The insulating layer 74 surrounds the insulating layer 73, and functions as a block insulating layer of the memory cell transistor MT. The insulating layer 74 is, for example, a silicon oxide layer. An insulating layer 77 is buried in the slit SLT2 excluding the memory pillar MP portion. The insulating layer 77 is, for example, a silicon oxide layer.

For example, an AlO layer 75 is provided around the memory pillar MP having the above configuration. For example, a barrier metal layer (TiN layer or the like) 76 is formed around the AlO layer 75. A wiring layer 11 functioning as a word line WL is provided around the barrier metal layer 76. The wiring layer 11 is made of, for example, tungsten.

With the above configuration, two memory cell transistors MT are provided in one memory pillar MP along the Y direction. The select transistors ST1 and ST2 also have the same configuration as described above.

Equivalent Circuit

Figure 13:
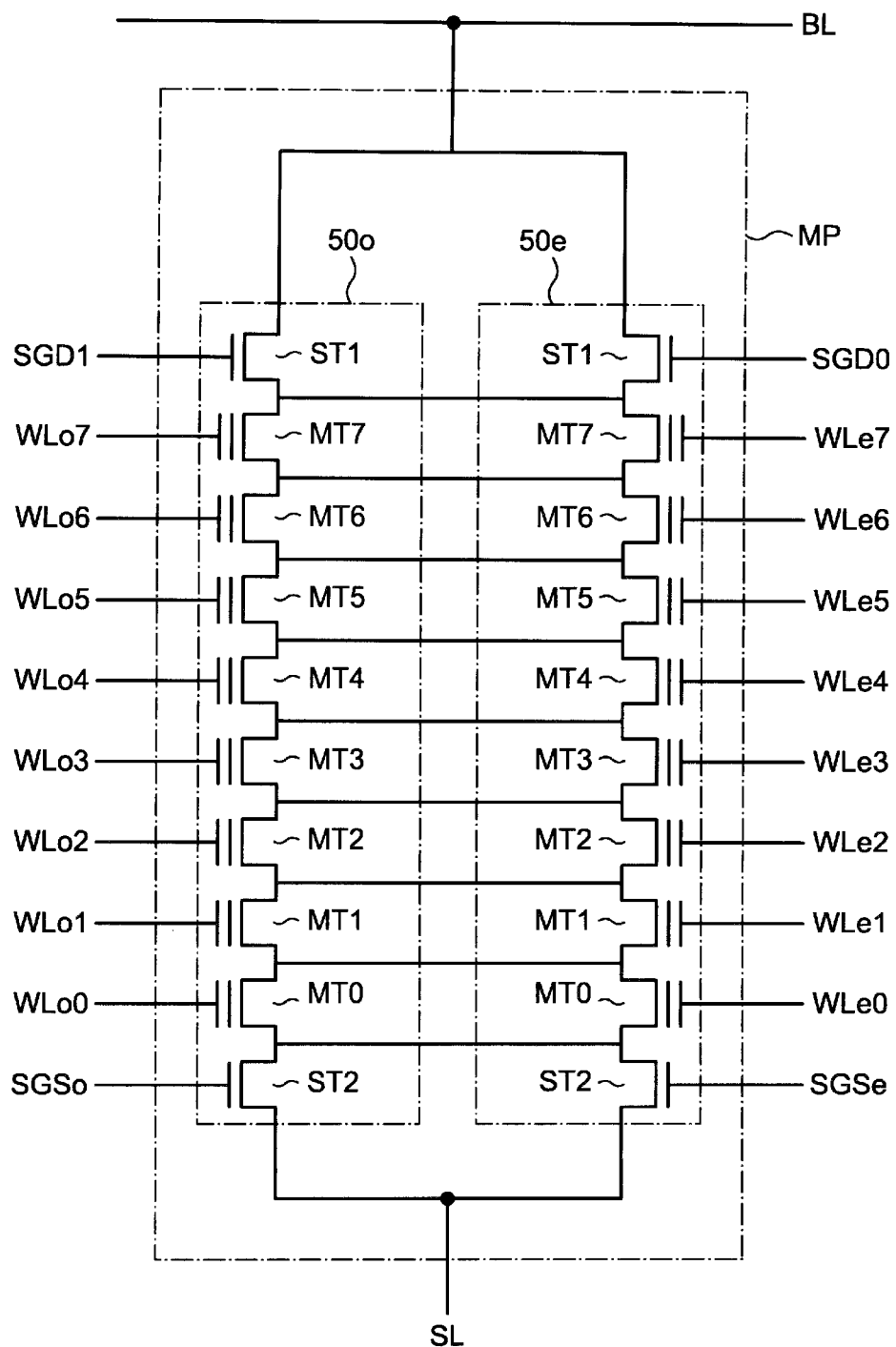
FIG. 13 is a diagram illustrating an equivalent circuit of adjacent strings in the semiconductor storage device according to the first embodiment.

FIG. 13 is a diagram illustrating an equivalent circuit of adjacent strings in the semiconductor storage device according to the embodiment. As illustrated in FIG. 13, two NAND strings 50o and 50e are formed in one memory pillar MP. Each of the NAND strings 50o and 50e includes a select transistor ST1, memory cell transistors MT0 to MT7, and a select transistor ST2, which are connected in series.

The NAND string 50o may be referred to as a "first string". The memory cell transistors MT0 to MT7 in the first string may be referred to as "first memory cells". A side on which the first string of the memory pillar MP is provided may be referred to as a "first side". The NAND string 50e may be referred to as a "second string". The memory cell transistor MT0 to MT7 in the second string may be referred to as "second memory cells". A side on which the second string of the memory pillar MP is provided may be referred to as a "second side". The second side is opposite to the first side with respect to the memory pillar MP.

The select transistor ST1 of the NAND string 50o is connected to a select gate line SGD1. The select transistor ST1 of the NAND string 50e is connected to a select gate line SGD0. The memory cell transistors MT0 to MT7 of the NAND string 50o are connected to word lines WLo0 to WLo7, respectively. The memory cell transistors MT0 to MT7 of the NAND string 50e are connected to word lines WLe0 to WLe7, respectively. The select transistor ST2 of the NAND string 50o is connected to a select gate line SGSo. The select transistor ST2 of the NAND string 50e is connected to a select gate line SGSe.

The word lines WLo0 to WLo7 connected to the memory cell transistors MT0 to MT7 in the NAND string 50o may be referred to as a "first word line". The word lines WLe0 to WLe7 connected to the memory cell transistors MT0 to MT7 in the NAND string 50e may be referred to as a "second word line".

The sources of the opposing select transistors ST1 are electrically connected to each other, and the drains thereof are also electrically connected to each other. The sources of the opposing memory cell transistors MT0 to MT7 are electrically connected to each other, and the drains thereof are also electrically connected to each other. The sources of the opposing select transistors ST2 are electrically connected to each other, and the drains thereof are also electrically connected to each other. The electrical connections described above are due to the fact that channels formed in the opposing transistors share a portion of the memory pillar MP.

The two NAND strings 50o and 50e in the same memory pillar MP are connected to the same bit line BL and the same source line SL.

Read Operation

A mode in which a select gate line SGD is selected will be described with reference to FIGS. 5 and 6.

When any one of the select gate lines SGD0 to SGD3 is selected, a voltage for turning ON the select transistor ST1 is supplied to one wiring layer 10-0 to 10-3 corresponding to each select gate line. For example, when the wiring layer 10-1 is selected, eight select transistors ST1 provided in the memory pillars MP0, MP1, MP4, MP5, MP8, MP9, MP12, and MP13 are turned ON. As a result, the eight memory cell transistors MT belonging to the above memory pillars are selected. That is, one page is formed by the above eight memory cell transistors MT. Since the operation when a wiring layer other than the wiring layer 10-1 is selected is the same as described above, description thereof will be omitted.

Figure 14:
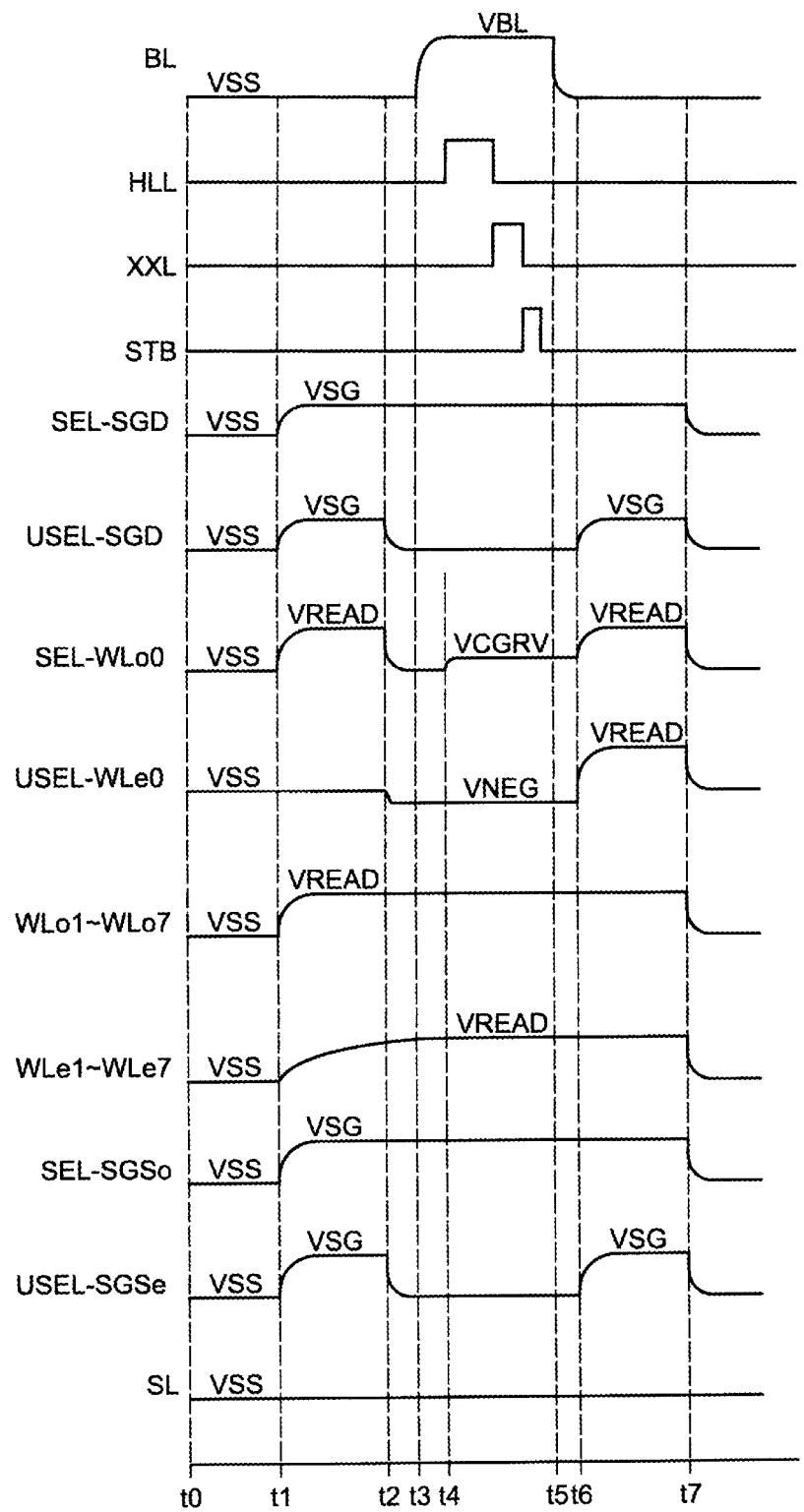
FIG. 14 is a timing chart illustrating the operation of the semiconductor storage device according to the first embodiment.

A method of reading data in the NAND flash memory having the above configuration will be described with reference to FIG. 14. FIG. 14 is a timing chart illustrating voltage changes of various wirings when the odd-numbered select gate lines SGDo (i.e., the odd-numbered memory groups MG) and word lines WLo0 are selected.

As illustrated in FIG. 14, at time t1, a voltage VSG is supplied to all select gate lines SGD (SEL-SGD and USEL-SGD) in a selected block BLK, so that the select transistor ST1 is turned ON. The select gate line SEL-SGD is a selected select gate line. The select gate line USEL-SGD is an unselected select gate line. Similarly, at time t1, the voltage VSG is supplied to all the select gate lines SGS (SEL-SGSo and USEL-SGSe) in the selected block BLK, so that the select transistor ST2 is turned ON. The select gate line SEL-SGSo is a selected select gate line. The select gate line USEL-SGSe is an unselected select gate line.

At time t1, a voltage VREAD is supplied to a word line SEL-WLo0 and word lines WLo1 to WLo7, so that the memory cell transistors MT0 to MT7 connected to these word lines are turned ON, regardless of the stored data. The word line SEL-WLo0 is a word line connected to the first memory cell transistor MT0 to be read. The word lines WLo1 to WLo7 are word lines connected to other memory cell transistors MT1 to MT7 in the same string as the memory cell transistor MT0 to be read. At time t1, a voltage VSS is continuously supplied to the word line USEL-WLe0.

Referring to FIG. 13, the word line USEL-WLe0 is connected to the memory cell transistor MT0 sharing a channel with the memory cell transistor MT0 in the NAND string 50o to be read. That is, the memory cell transistor MT0 connected to the word line SEL-WLo0 and the memory cell transistor MT0 connected to the word line USEL-WLe0 share a channel. The above operation is an initial operation in the read operation.

As illustrated in FIG. 14, at time t1, the voltage VREAD is also supplied to the word lines WLe1 to WLe7. However, the timing at which a voltage supplied to the word lines WLe1 to WLe7 reaches the voltage VREAD is different from the timing at which a voltage supplied to the word lines SEL-WLo0 and the word lines WLo1 to WLo7 reaches the voltage VREAD. In the present embodiment, after the voltage supplied to the word lines SEL-WLo0 and the word lines WLo1 to WLo7 reaches the voltage VREAD, the voltage supplied to the word lines WLe1 to WLe7 reaches the voltage VREAD.

The above example represents an operation of reading data of the first (k=1) memory cell transistor MT0 (the first memory cell) in the NAND string 50o (the first string), but the same operation is performed even when data of the second to eighth (k=2 to 8) memory cell transistors MT1 to MT7 in the NAND string 50o (the first string) are read. Therefore, in general, in the initial operation in the read operation, after the voltage supplied to the first word line connected to the k-th first memory cell in the first string (e.g., SEL-WLok) reaches a first voltage (e.g., the voltage VREAD), the voltage supplied to the second word lines connected to the second memory cells other than the k-th second memory cell in the second string (e.g., the word lines WLe1 to WLe7 excluding WLek) reaches the first voltage (e.g., the voltage VREAD).

In the present embodiment, from time t1, that is, at the same time with the supply of the voltage to the first word lines, the supply of the voltage to the second word lines excluding the second word line connected to the k-th second memory cell is started. However, the boosting speed of the voltage supplied to the second word lines is slower than the boosting speed of the voltage supplied to the first word lines. As a result, as described above, after the voltage supplied to the first word lines reaches the first voltage, the voltage supplied to the second word lines excluding the second word line connected to the k-th second memory cell reaches the first voltage.

Returning to the example of FIG. 14, the voltage supplied to the word lines WLe1 to WLe7 reaches the voltage VREAD by time t4 to be described later. In other words, in the above initial operation, the voltage supplied to the word lines WLe1 to WLe7 reaches the voltage VREAD before a read voltage VCGRV is supplied to the word line SEL-WLo0 immediately before the read operation is started at time t4 as described later.

In the present embodiment, the voltage VREAD is supplied to all the word lines WLe1 to WLe7 connected to the memory cell transistors MT1 to MT7 in the NAND string 50e at the same timing. However, the present embodiment is not limited to this configuration. For example, the voltage VREAD may be supplied to some of the word lines WLe1 to WLe7 at the same timing as the word line SEL-WLo0.

As described above, when the voltage VSG is supplied to the select gate line SEL-SGD and the select gate line SEL-SGS, the select transistors ST1 and ST2 are turned ON. When the voltage VREAD is supplied to the word line SEL-WLo0 and the word lines WLo1 to WLo7, the memory cell transistors MT0 to MT7 are turned ON, regardless of the stored data. As a result, in the selected block BLK, all the transistors in the NAND string 50o are brought into a conductive state, so that the voltage VSS (e.g., 0 V) is supplied to the channel of each transistor.

Next, at time t2, the voltage VSS is supplied to the select gate line USEL-SGD, the word line SEL-WLo0, and the select gate line USEL-SGSe. Similarly, at time t2, a voltage VNEG is supplied to the word line USEL-WLe0. In other words, the voltage supplied to the word line SEL-WLo0 drops from the voltage VREAD and the voltage supplied to the word line USEL-WLe0 drops. The voltage VNEG is a voltage for forcibly turning OFF the memory cell transistor MT. That is, the voltage VNEG is a voltage sufficiently lower than the threshold voltage of the memory cell transistor MT in a state where data is erased.

Next, at time t3, the bit lines BL are pre-charged by the sense amplifier 31. By this operation, a voltage VBL is supplied to each of the bit lines BL (e.g., BL0 to BL7). While the details will be described later, as illustrated in FIG. 14, the sense amplifier 31 is controlled by a control signal HLL, a control signal XXL, and a control signal STB.

Next, at time t4, in a state where the voltage VSG is supplied to the selected select gate lines SEL-SGD and SEL-SGSo, the read voltage VCGRV is supplied to the selected word line SEL-WLo0. At time t4, the voltage VNEG is supplied to the unselected word line USEL-WLe0, and the voltage VREAD is supplied to the other unselected word lines WLo1 to WLo7 and word lines WLe1 to WLe7. The read voltage VCGRV is a voltage according to a read level and is a voltage for determining whether the stored data of the selected memory cell transistor MT is "0" or "1". As described above, the voltage VNEG is a voltage for forcibly turning OFF the memory cell transistor MT.

Next, at time t5, when the read operation is completed, the voltage supplied to each of the bit lines BL0 to BL7 changes from the voltage VBL to the voltage VSS. Next, at time t6, the voltage VSG is supplied to the unselected select gate lines USEL-SGD and USEL-SGSe, and the voltage VREAD is supplied to the selected word line SEL-WLo0 and the unselected word line USEL-WLe0. The voltage VSG is continuously supplied to the select gate lines SEL-SGD and SEL-SGSo other than the above. The voltage VREAD is continuously supplied to the word lines WLo1 to WLo7 and WLe1 to WLe7.

When the read is performed on the first memory cell transistor MT0 in the NAND string 50o by the above operation, the channel is shared with the memory cell transistor MT0 and the first memory cell transistor MT0 in the NAND string 50e is forcibly turned OFF. Therefore, it is possible to target a memory cell transistor MT to be read and eliminate the influence of a memory cell transistor MT not to be read. Further, since all the memory cell transistors MT1 to MT7 other than the first memory cell transistor MT0 are in the turn-ON state, the resistance component of the memory cell transistors MT1 to MT7 other than the memory cell transistor MT0 to be read can be reduced. As a result, the value of the memory cell transistor MT0 to be read can be read more accurately.

In the present embodiment, after the voltage supplied to the word line SEL-WLo0 and the word lines WLo1 to WLo7 reaches the voltage VREAD, the voltage supplied to the word lines WLe1 to WLe7 reaches the voltage VREAD. That is, a rapid boost is performed on a select gate line and a word line that require the rapid boost, and a gentle boost is performed on a word line that does not require the rapid boost. By such an operation, it is possible to perform a rapid read operation on each select gate line and word line while preventing the generation of a peak current (details thereof will be described later) generated when a voltage is supplied.

Comparative Example

Figure 21:
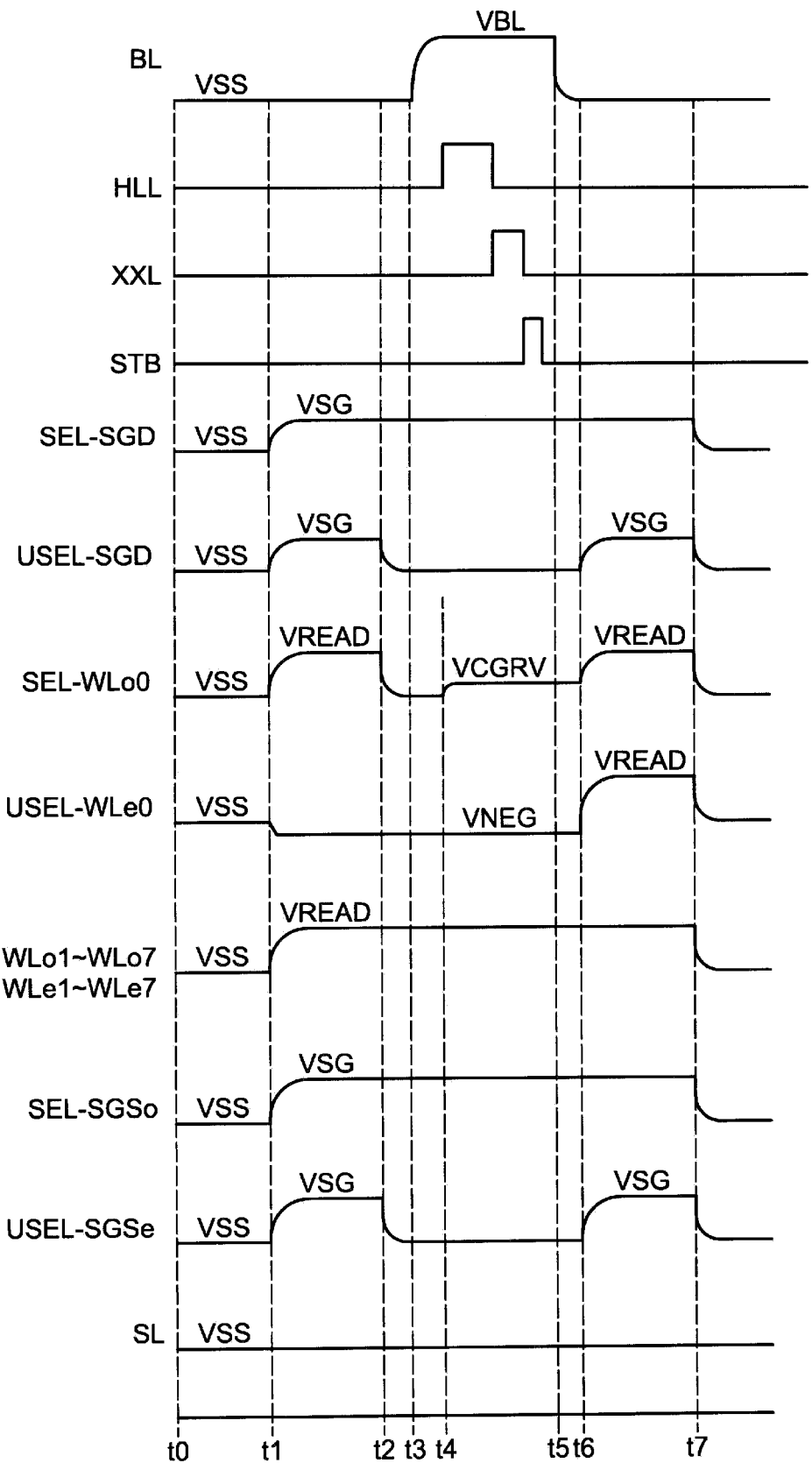
FIG. 21 is a timing chart illustrating the operation of a semiconductor storage device of the related art.

The operation of a comparative example will be described with reference to FIG. 21. As illustrated in FIG. 21, in the comparative example, at time t1, the same voltages are supplied the select gate lines SEL-SGD, USEL-SGD, SEL-SGSo, and USEL-SGSe and the same voltages are supplied to the word lines SEL-WLo0, WLo1 to WLo7, and WLe1 to WLe7. That is, in the comparative example, the timing at which the voltage supplied to the word lines WLo1 to WLo7 and the word lines WLe1 to WLe7 reaches the voltage VREAD is the same as the timing at which the voltage supplied to the word line SEL-WLo0 reaches the voltage VREAD.

As described above, in the comparative example, the voltage is supplied to all the word lines and the select gate lines, except for the unselected word line USEL-WLe0 at almost the same time. Generally, when a voltage is supplied to a signal line, a current load corresponding to the capacitance load of the signal line is generated. In the comparative example, since the voltage is supplied to many signal lines (and thus to a large capacitance load) at the same time, the current load in the entire semiconductor storage device increases instantaneously. In the present specification, this phenomenon is referred to as the occurrence of a peak current. In order to prevent the generation of such a peak current, it is conceivable to slow down the rise of a voltage when the voltage is supplied. However, when the voltage rise at the time of voltage supply is simply slowed down, a period until the read operation is completed becomes long.

Here, in order to improve or maintain the speed of the read operation, it is preferable to supply a steep voltage to at least the word lines WLo0 to WLo7 connected to the memory cell transistors MT0 to MT7 belonging to the NAND string 50o including the memory cell transistor MT0 to be read. Here, as described in relation to FIG. 13, since the channels formed in the opposing transistors share a portion of the memory pillar MP, the sources of the opposing memory cell transistors MT0 to MT7 are electrically connected to each other and the drains thereof are electrically connected to each other. In this case, by supplying a voltage to the word lines WLo0 to WLo7 connected to the memory cell transistors MT0 to MT7 belonging to the NAND string 50o, the effect of supplying electric charges to the channels of the memory cell transistors MT0 to MT7 belonging to the NAND string 50e also may be obtained. Therefore, it is preferable to supply the steep voltage to the word lines WLo0 to WLo7 connected to the memory cell transistors MT0 to MT7 belonging to the NAND string 50*o* including the memory cell transistor MT0 to be read. However, it is not necessary to supply the above steep voltage to the word lines WLe1 to WLe7 connected to the memory cell transistors MT belonging to the NAND string 50*e* facing the NAND string 50*o*.

Therefore, as illustrated in FIG. 14, the voltage supplied to the word lines WLe1 to WLe7 may be increased more gradually. In this way, the configuration according to the present embodiment may reduce the number of signal lines for supplying the steep voltage, so that the generation of the peak current as described above may be prevented. Further, when the generation of the similar peak current is allowed, it is possible to supply an even steeper voltage to the word lines WLo0 to WLo7.

Further, in the comparative example illustrated in FIG. 21, at time t1, the voltage VNEG is supplied to the word line USEL-WLe0. Meanwhile, at time t1, a voltage is supplied to the signal lines other than the word line USEL-WLe0. When the voltage is supplied to the other signal lines, the voltage of the word line USEL-WLe0 tends to rise due to the influence of capacitive coupling. Therefore, in order to step down the voltage of the word line USEL-WLe0, it is necessary to counter the influence of the voltage supplied to other signal lines, and thus, larger power than usual is required.

Meanwhile, as illustrated in FIG. 14, the voltage of the word line USEL-WLe0 is stepped down at the timing when the voltage supplied to the select gate line USEL-SGD, the word line SEL-WLo0, and the select gate line USEL-SGSe decreases from the voltages VSG and VREAD to the voltage VSS. Therefore, the power required for stepping down the word line USEL-WLe0 may be reduced. Further, since the step-down timing of the word line USEL-WLe0 and the step-down timing of the word line SEL-WLo0 are the same, the time for such stepping-down may be shortened. As a result, the period until the read operation is completed may be further shortened.

Circuit Configuration of Sense Amplifier Unit

Figure 15:
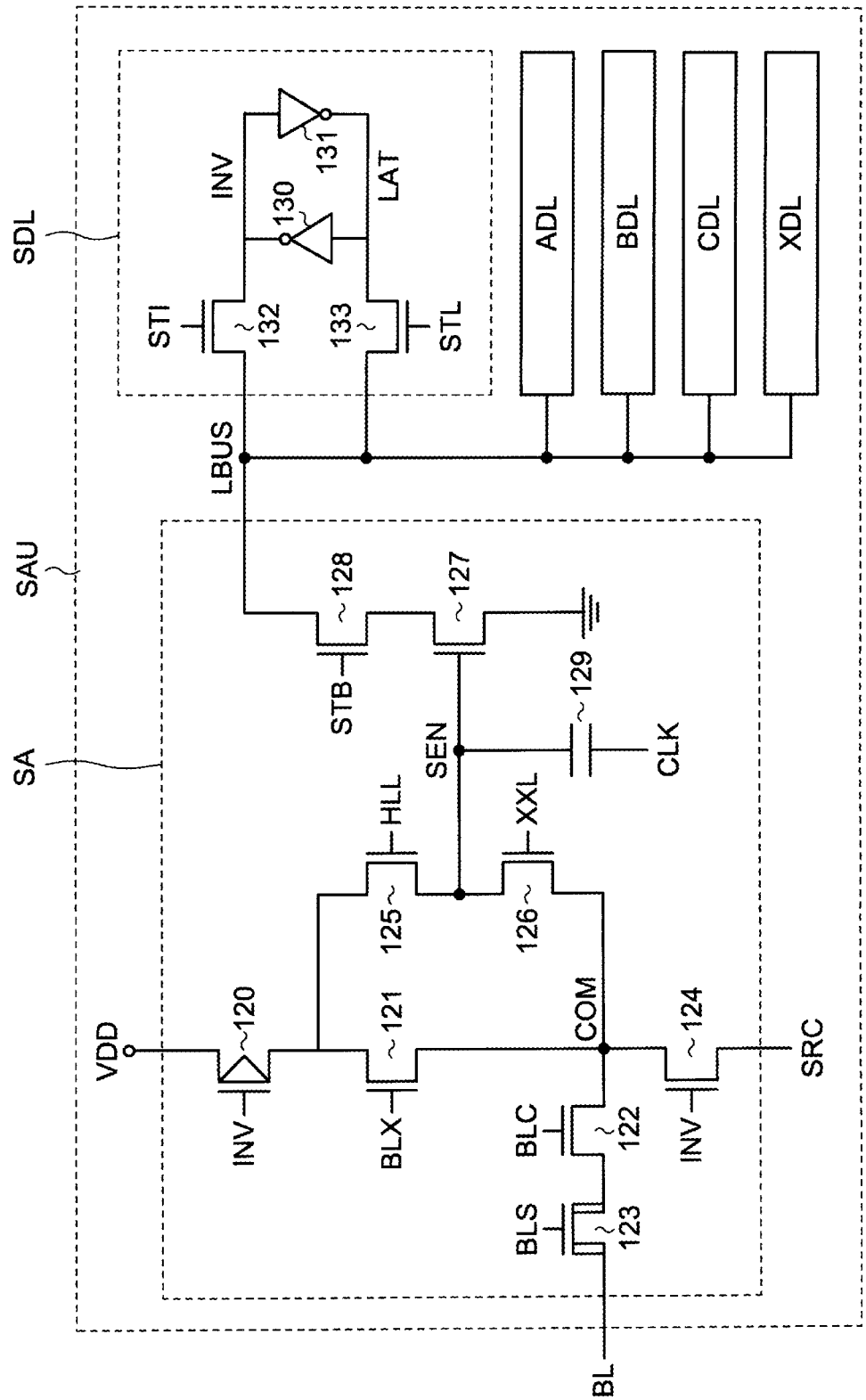
FIG. 15 is an example of a circuit configuration of a sense amplifier of the semiconductor storage device according to the first embodiment.

Next, an example of the circuit configuration of a sense amplifier unit SAU will be described. FIG. 15 is an example of the circuit configuration of a sense amplifier unit SAU. The circuit configuration of the sense amplifier unit SAU illustrated in FIG. 15 is an example, and the circuit configuration of the sense amplifier unit SAU of a nonvolatile semiconductor storage device according to the present embodiment is not limited to the example illustrated in FIG. 15.

The sense amplifier 31 illustrated in FIG. 3 includes a plurality of sense amplifier units SAU associated with bit lines BL0 to BLm (m is a natural number of 1 or more). FIG. 15 illustrates the circuit configuration of one sense amplifier unit SAU.

The sense amplifier unit SAU may temporarily store the read data at, for example, the corresponding bit line BL. The sense amplifier unit SAU may perform the logical operation using temporarily stored data. While the details will be described later, the semiconductor storage device 5 may execute the read operation according to the present embodiment by using the sense amplifier 31 (in particular, the sense amplifier unit SAU).

As illustrated in FIG. 15, the sense amplifier unit SAU includes a sense amplifier part SA and latch circuits SDL, ADL, BDL, CDL, and XDL. The sense amplifier part and the latch circuits are connected by a bus LBUS so as to exchange data with each other.

For example, in the read operation, the sense amplifier part SA senses the read data on the corresponding bit line BL, and determines whether the read data is "0" or "1". The sense amplifier part SA includes, for example, a p-channel MOS transistor 120, n-channel MOS transistors 121 to 128, and a capacitor 129.

One end of the transistor 120 is connected to a power supply line, and the gate of the transistor 120 is connected to a node INV in the latch circuit SDL. One end of the transistor 121 is connected to the other end of the transistor 120, the other end of the transistor 121 is connected to a node COM, and a control signal BLX is input to the gate of the transistor 121. One end of the transistor 122 is connected to the node COM, and a control signal BLC is input to the gate of the transistor 122. The transistor 123 is a high breakdown voltage MOS transistor, one end of the transistor 123 is connected to the other end of the transistor 122, the other end of the transistor 123 is connected to the corresponding bit line BL, and a control signal BLS is input to the gate of the transistor 123.

One end of the transistor 124 is connected to the node COM. The other end of the transistor 124 is connected to a node SRC. The gate of the transistor 124 is connected to the node INV. One end of the transistor 125 is connected to the other end of the transistor 120. The other end of the transistor 125 is connected to a node SEN. The control signal HLL is input to the gate of the transistor 125. One end of the transistor 126 is connected to the node SEN. The other end of the transistor 126 is connected to the node COM, and the control signal XXL is input to the gate of the transistor 126.

One end of the transistor 127 is grounded, and the gate of the transistor 127 is connected to the node SEN. One end of the transistor 128 is connected to the other end of the transistor 127, the other end of the transistor 128 is connected to the bus LBUS, and the control signal STB is input to the gate of the transistor 128. One end of the capacitor 129 is connected to the node SEN, and a clock CLK is input to the other end of the capacitor 129.

The control signals BLX, BLC, BLS, HLL, XXL, and STB described above are generated by, for example, the sequencer 27 illustrated in FIG. 3. For example, a voltage VDD, which is the internal power supply voltage of the semiconductor storage device 5, is applied to the power supply line connected to one end of the transistor 120, and for example, a voltage VSS, which is the ground voltage of the semiconductor storage device 5, is applied to the node SRC.

The latch circuits SDL, ADL, BDL, CDL, and XDL temporarily store the read data. The latch circuit XDL is connected to, for example, the register 26, and is used for input/output of data between the sense amplifier unit SAU and the input/output circuit 22.

The latch circuit SDL includes, for example, inverters 130 and 131 and n-channel MOS transistors 132 and 133. The input node of the inverter 130 is connected to a node LAT. The output node of the inverter 130 is connected to the node INV. The input node of the inverter 131 is connected to the node INV, and the output node of the inverter 131 is connected to the node LAT. One end of the transistor 132 is connected to the node INV, the other end of the transistor 132 is connected to the bus LBUS, and a control signal STI is input to the gate of the transistor 132. One end of the transistor 133 is connected to the node LAT, the other end of the transistor 133 is connected to the bus LBUS, and a control signal STL is input to the gate of the transistor 133. For example, the data stored in the node LAT corresponds to the data stored in the latch circuit SDL, and the data stored in the node INV corresponds to the inverse of the data stored in the node LAT. Since the circuit configuration of the latch circuits ADL, BDL, CDL, and XDL is the same as the circuit configuration of the latch circuit SDL, description thereof will be omitted.

In the sense amplifier 31 described above, the timing at which each sense amplifier unit SAU determines the read data on the bit line BL is based on the timing at which the control signal STB is asserted. In the present specification and the like, the description that the "sequencer 27 asserts the control signal STB" corresponds to a description that the sequencer 27 changes the control signal STB from an "L" level to an "H" level.

The configuration of the sense amplifier 31 according to the present embodiment is not limited to the above configuration. For example, in the sense amplifier unit SAU, the transistor 128 to whose gate the control signal STB is input may be implemented by a p-channel MOS transistor. In this case, the description that the "sequencer 27 asserts the control signal STB" corresponds to a description that the sequencer 27 changes the control signal STB from an "H" level to an "L" level.

The number of latch circuits in the sense amplifier unit SAU may be selected based on, for example, the number of bits of data stored by one memory cell transistor MC. A plurality of bit lines BL may be connected to one sense amplifier unit SAU via a selector.

Boost Drive Circuit

Figure 16:
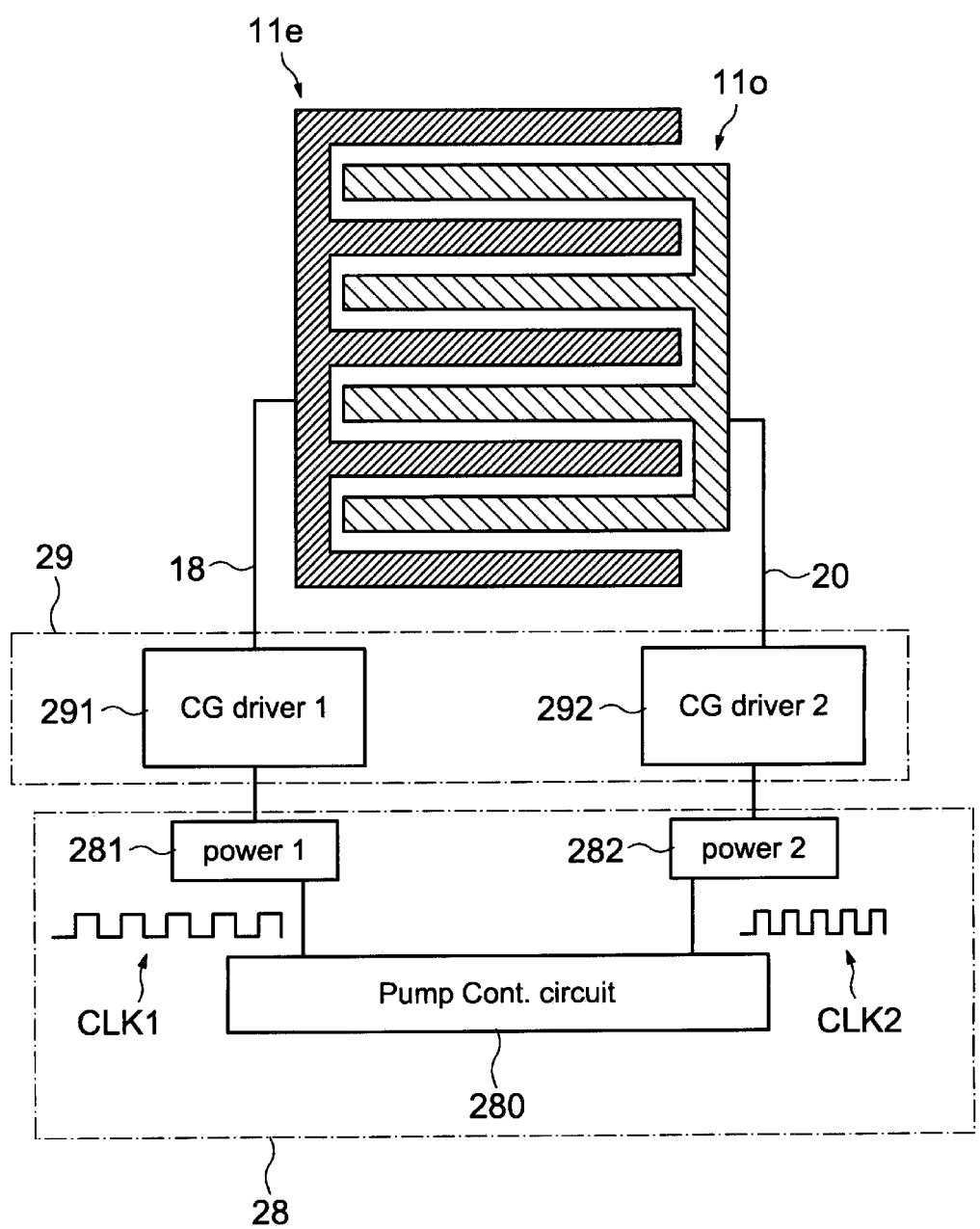
FIG. 16 is a circuit diagram illustrating an example of a circuit configuration of a boost drive circuit of the semiconductor storage device according to the first embodiment.

The detailed configuration of the voltage generation circuit 28 and the driver set 29 (see FIG. 3) according to the present embodiment will be described with reference to FIG. 16. As illustrated in FIG. 16, the voltage generation circuit 28 includes a boost drive circuit 280 (Pump Cont. circuit 280), a first power supply circuit 281 (power 1), and a second power supply circuit 282 (power 2). The driver set 29 includes a first control gate driver 291 (CG driver 1) and a second control gate driver 292 (CG driver 2). The first control gate driver 291 is connected to the wiring layer 11e via the metal wiring layer 18 (see FIG. 8). The second control gate driver 292 is connected to the wiring layer 11o via the metal wiring layer 20. The boost drive circuit 280 controls the first power supply circuit 281 and the second power supply circuit 282 with clock signals having different frequencies.

The first power supply circuit 281 and the first control gate driver 291 may be collectively referred to as a "first voltage supply circuit". The second power supply circuit 282 and the second control gate driver 292 may be collectively referred to as a "second voltage supply circuit". The boost drive circuit 280 supplies clock signals having different frequencies to the first voltage supply circuit and the second voltage supply circuit, respectively.

Specifically, the boost drive circuit 280 controls the first power supply circuit 281 with a clock CLK1, and controls the second power supply circuit 282 with a clock CLK2 which has a higher frequency than the clock CLK1. When the frequencies of the clock signals for controlling the power supplies of the first power supply circuit 281 and the second power supply circuit 282 are high, the boosting speed of these power supplies is high, and when the frequencies of the clock signals are low, the boosting speed of these power supplies is low. As a result, the boosting speed of the voltage supplied to the wiring layer 11o is relatively high, for example, as in the word lines WLo1 to WLo7 of FIG. 14, and the boosting speed of the voltage supplied to the wiring layer 11e is relatively low as in the word lines WLe1 to WLe7 of FIG. 14.

Circuit Diagram of First Power Supply Circuit 281 and Second Power Supply Circuit 282

Figure 17:
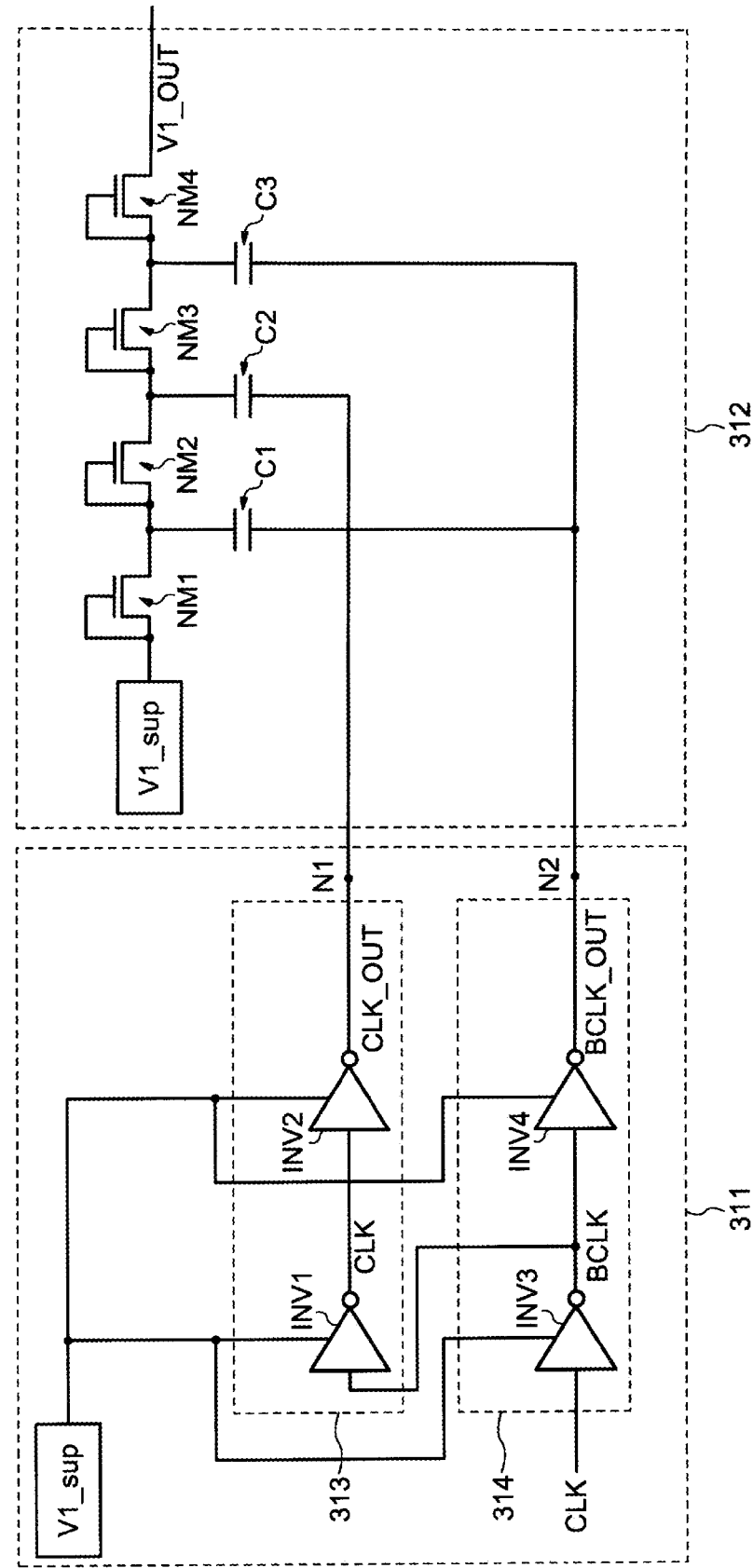
FIG. 17 is a circuit diagram illustrating an example of a circuit configuration of a boost circuit of the semiconductor storage device according to the first embodiment.

The circuit diagram of the first power supply circuit 281 and the second power supply circuit 282 will be described with reference to FIG. 17. The first power supply circuit 281 and the second power supply circuit 282 have the same circuit configuration. FIG. 17 is a circuit diagram illustrating an example of the circuit configuration of a boost circuit of the semiconductor storage device according to the embodiment. The first power supply circuit 281 and the second power supply circuit 282 illustrated in FIG. 17 are examples, and do not limit the configuration of the first power supply circuit 281 and the second power supply circuit 282 of the present embodiment.

As illustrated in FIG. 17, the first power supply circuit 281 and the second power supply circuit 282 each include a clock signal generation circuit 311 and a charge pump 312.

The charge pump 312 includes NMOS transistors NM1 to NM4 and capacitors C1 to C3. The number of NMOS transistors and capacitors in the charge pump 312 is not limited to the above.

Each of the NMOS transistors NM1 to NM4 is diode-connected and functions as a diode. The current paths of the NMOS transistors NM1 to NM4 are connected in series in order.

One ends of the capacitors C1 to C3 are electrically connected to one ends of the NMOS transistors NM2 to NM4, respectively. A clock signal CLK_OUT is supplied to the other end of the capacitor C2, and a clock signal BCLK_OUT is supplied to the other ends of the capacitors C1 and C3. The clock signal BCLK_OUT is an inverse of the clock signal CLK_OUT.

A voltage V1_sup is supplied (input) to one end of the NMOS transistor NM1. Then, an output voltage V1_OUT larger than the voltage V1_sup is generated when the capacitors C1 to C3 are clocked by the clock signals CLK_OUT and BCLK_OUT and the input voltage V1_sup is boosted. The NMOS transistors NM1 to NM4 are transfer transistors. In this way, the output voltage V1_OUT is transferred (output) to the other end of the NMOS transistor NM4.

The clock signal generation circuit 311 includes a clock signal generation circuit 313 and a clock signal generation circuit 314. A clock signal BCLK is input to the clock signal generation circuit 313, and a clock signal CLK_OUT is output from the clock signal generation circuit 313. The clock signal CLK is input to the clock signal generation circuit 314, and a clock signal BCLK_OUT is output from the clock signal generation circuit 314. The clock signal BCLK is an inverse signal of the clock signal CLK.

The clock signal generation circuit 313 includes inverters INV1 and INV2. The clock signal generation circuit 314 includes inverters INV3 and INV4.

The input terminal of the inverter INV1 is electrically connected to the output terminal of the inverter INV3. The clock signal BCLK is supplied to the input terminal of the inverter INV1. The voltage V1_sup is supplied to the power supply terminal of the inverter INV1. The clock signal CLK is output to the output terminal of the inverter INV1.

The input terminal of the inverter INV2 is electrically connected to the output terminal of the inverter INV1. The clock signal CLK is supplied to the input terminal of the inverter INV2. The voltage V1_sup is supplied to the power supply terminal of the inverter INV2. The output terminal of the inverter INV2 is electrically connected to a node N1. The clock signal CLK_OUT is output to the node N1.

The clock signal CLK is supplied to the input terminal of the inverter INV3. The voltage V1_sup is supplied to the power supply terminal of the inverter INV3. The clock signal BCLK is output to the output terminal of the inverter INV3.

The input terminal of the inverter INV4 is electrically connected to the output terminal of the inverter INV3. The clock signal BCLK is supplied to the input terminal of the inverter INV4. The voltage V1_sup is supplied to the power supply terminal of the inverter INV4. The output terminal of the inverter INV4 is electrically connected to a node N2, and the clock signal BCLK_OUT is output to the node N2.

The clocks CLK1 and CLK2 from the boost drive circuit 280 illustrated in FIG. 16 are input to the inverter INV3 provided in the first power supply circuit 281 and the second power supply circuit 282, respectively. When the frequency of the clock input to the inverter INV3 is relatively high, the output voltage V1_OUT output from the power supply circuit is sharply boosted, and when the frequency of the clock is relatively low, the output voltage V1_OUT output from the power supply circuit is smoothly boosted. The above configuration implements the operation illustrated in FIG. 14. However, the configuration that implements the operation illustrated in FIG. 14 is not limited to the above configuration.

Second Embodiment

Figure 18:
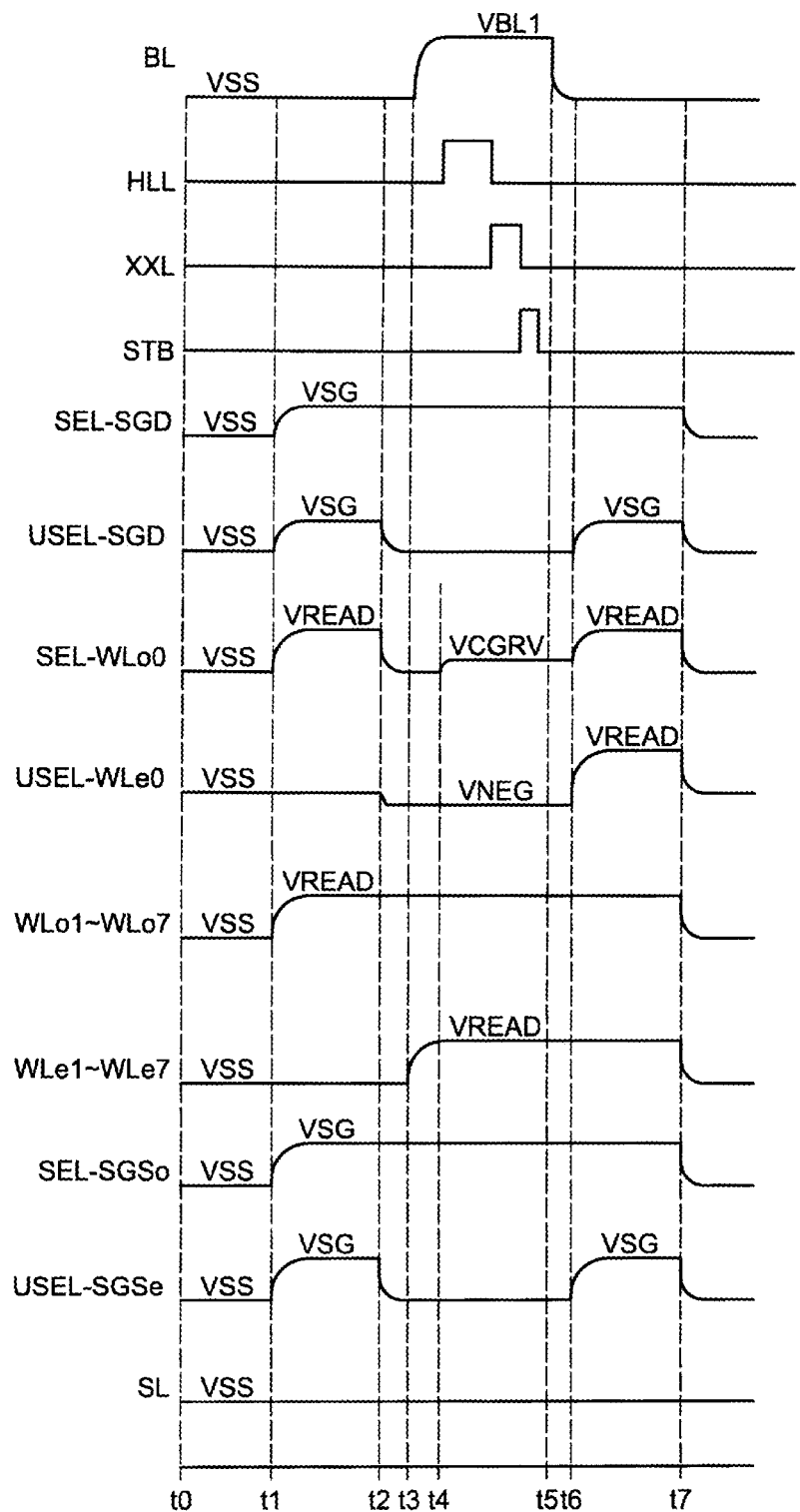
FIG. 18 is a timing chart illustrating the operation of a semiconductor storage device according to a second embodiment.

A memory system according to a second embodiment will be described with reference to FIG. 18. FIG. 18 is a timing chart illustrating the operation of a semiconductor storage device according to a second embodiment. The timing chart illustrated in FIG. 18 is similar to the timing chart illustrated in FIG. 14, except that the timing at which the voltage VREAD starts to be supplied to the word lines WLe1 to WLe7 is different from the timing chart illustrated in FIG. 14. In the following description, the same features as the configuration of FIG. 14 will be omitted, and differences from the configuration of FIG. 14 will be mainly described.

Read Operation

As illustrated in FIG. 18, the start of the supply of the voltage supplied to the word lines WLe1 to WLe7 is later than the start of the supply of the voltage supplied to the word line SEL-WLo0. Specifically, the supply of the voltage VREAD to the word line SEL-WLo0 is started at time t1, and the supply of the voltage VREAD to the word lines WLe1 to WLe7 is started at time t3. In this embodiment, the boosting speeds of the voltage VREAD for the word line SEL-WLo0 and the word lines WLe1 to WLe7 are the same.

The voltage of the word lines WLe1 to WLe7 has only to reach the voltage VREAD by time t4. Therefore, the supply of the voltage VREAD to the word lines WLe1 to WLe7 may be started before or after time t3. The boosting speed of the voltage VREAD for the word lines WLe1 to WLe7 may be slower than the boosting speed of the voltage VREAD for the word line SEL-WLo0 as in FIG. 14.

Figure 19:
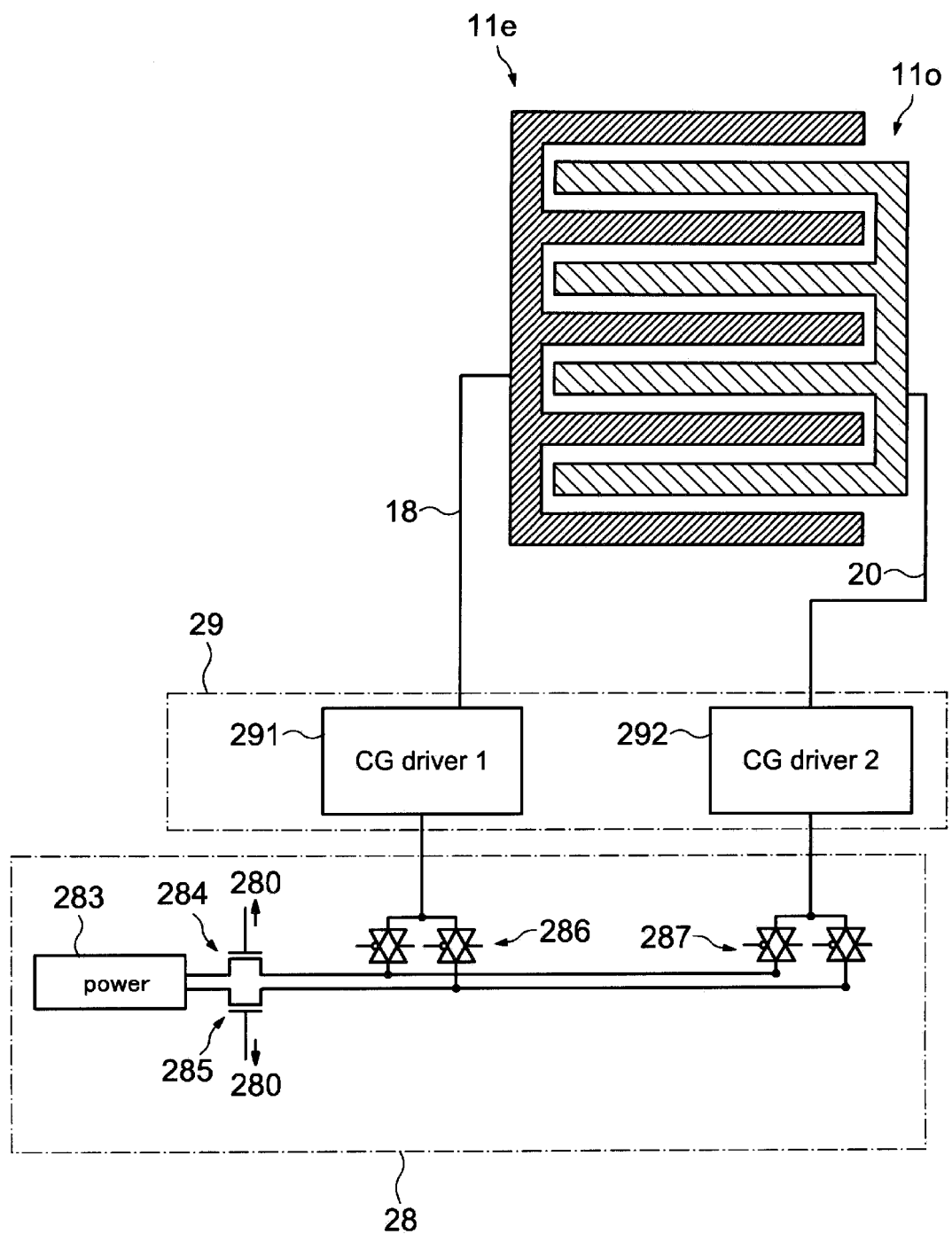
FIG. 19 is a circuit diagram illustrating an example of a circuit configuration of a boost drive circuit of the semiconductor storage device according to the second embodiment.

The detailed configuration of the voltage generation circuit 28 and the driver set 29 (see FIG. 3) according to the present embodiment will be described with reference to FIG. 19. FIG. 19 is a circuit diagram illustrating an example of the circuit configuration of a boost drive circuit of the semiconductor storage device according to the embodiment. As illustrated in FIG. 19, the voltage generation circuit 28 includes a power supply circuit 283 (power 283), a first transistor 284, a second transistor 285, a first switching circuit 286, and a second switching circuit 287. The driver set 29 includes a first control gate driver 291 (CG driver 1) and a second control gate driver 292 (CG driver 2).

The first transistor 284 and the second transistor 285 are transistors that may be individually controlled by the boost drive circuit 280. In the present embodiment, the operation illustrated in FIG. 18 is implemented by the timing at which these transistors are controlled. The first switching circuit 286 is connected to the output terminals of the first transistor 284 and the second transistor 285, and transfers a voltage output from one of the output terminals to the first control gate driver 291. The second switching circuit 287 is connected to the output terminals of the first transistor 284 and the second transistor 285, and transfers a voltage output from the output terminal not selected by the first switching circuit 286 to the second control gate driver 292.

In the above configuration, the first transistor 284 is provided between the power supply circuit 283 and the wiring layer 11o. Similarly, the second transistor 285 is provided between the power supply circuit 283 and the wiring layer 11e.

At time t1 in the timing chart illustrated in FIG. 18, the second transistor 285 is controlled to transmit the voltage VREAD from the power supply circuit 283, and the output terminal of the second transistor 285 and the second control gate driver 292 are electrically connected by the second switching circuit 287. As a result, the voltage VREAD is supplied to the wiring layer 11o. Thereafter, at time t3, the first transistor 284 is controlled to transmit the voltage VREAD from the power supply circuit 283, and the output terminal of the first transistor 284 and the first control gate driver 291 are electrically connected by the first switching circuit 286. As a result, the voltage VREAD is supplied to the wiring layer 11e. That is, a voltage is supplied to the gate terminal of the first transistor 284 at the timing different from that of the gate terminal of the second transistor 285. In other words, after the second transistor 285 is turned ON, the first transistor 284 is turned ON.

The first transistor 284, the first switching circuit 286, and the second switching circuit 287 may be collectively referred to as a "first voltage supply circuit". The second transistor 285, the first switching circuit 286, and the second switching circuit 287 may be collectively referred to as a "second voltage supply circuit". The first switching circuit 286 and the second switching circuit 287 may be omitted.

The operation illustrated in FIG. 18 may also be implemented by the circuit configuration illustrated in FIG. 16. Specifically, the operation illustrated in FIG. 18 may be implemented by controlling the timing at which the clocks CLK1 and CLK2 from the boost drive circuit 280 are supplied to the first power supply circuit 281 and the second power supply circuit 282 in FIG. 16.

As described above, when the timing at which the voltage supplied to the word lines WLe1 to WLe7 reaches the voltage VREAD is different from the timing at which the voltage supplied to the other signal lines reaches the voltages VREAD and VSG, the generation of a peak current can be prevented similarly to the operation of FIG. 14.

The operation illustrated in FIG. 14 may also be implemented by the circuit configuration illustrated in FIG. 19.

Specifically, the operation illustrated in FIG. 14 may be implemented by controlling a voltage supplied to each of the gates of the first transistor 284 and the second transistor 285 in a state where the output terminal of the first transistor 284 and the first control gate driver 291 are electrically connected by the first switching circuit 286 and the output terminal of the second transistor 285 and the second control gate driver 292 are electrically connected by the second switching circuit 287, for example, by making a speed at which the first transistor 284 changes from an OFF state to an ON state slower than a speed at which the second transistor 285 changes from an OFF state to an ON state.

Third Embodiment

Figure 20:
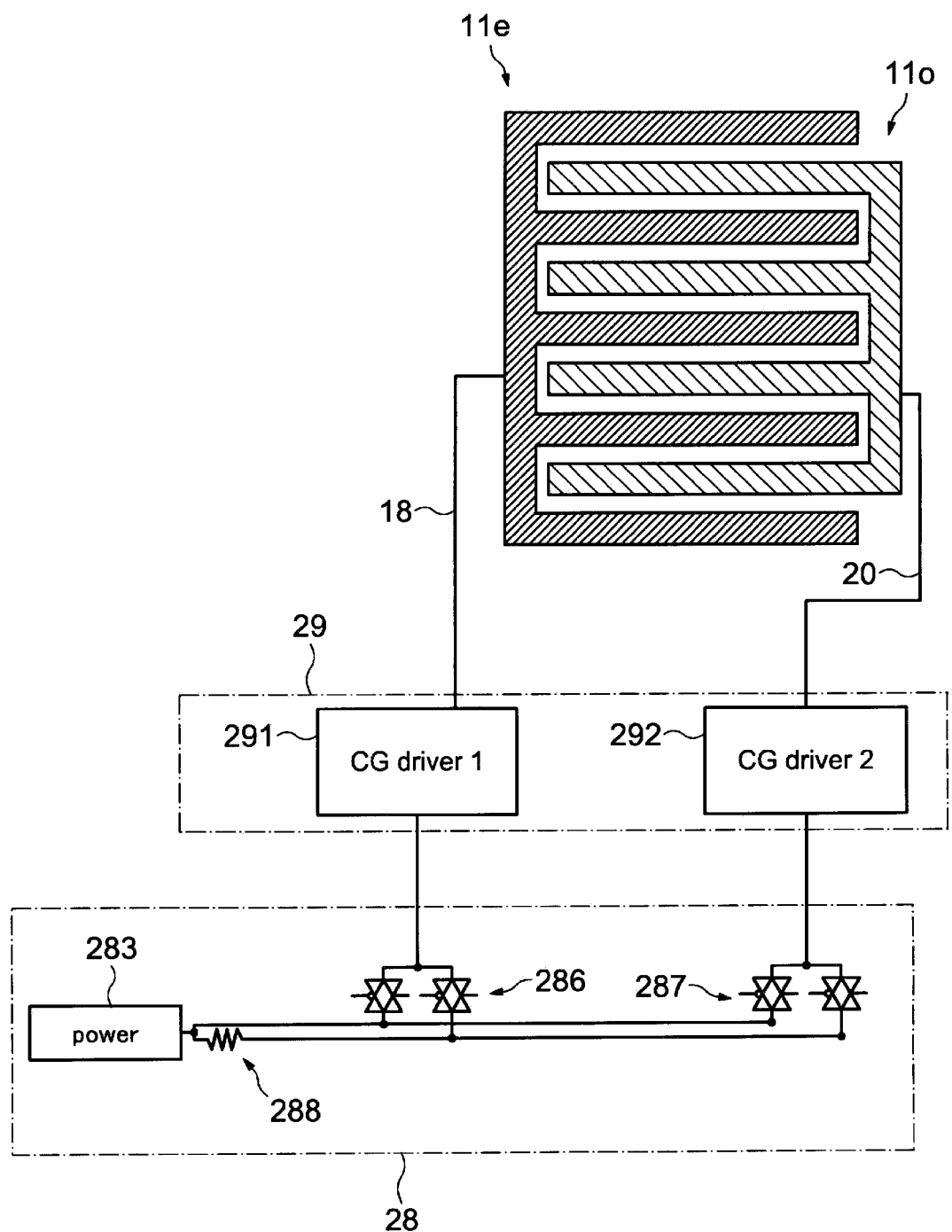
FIG. 20 is a circuit diagram illustrating an example of a circuit configuration of a boost drive circuit of a semiconductor storage device according to a third embodiment.

A memory system according to a third embodiment will be described with reference to FIG. 20. FIG. 20 is a circuit diagram illustrating an example of the circuit configuration of a boost drive circuit of a semiconductor storage device according to a third embodiment. As illustrated in FIG. 20, the voltage generation circuit 28 includes a power supply circuit 283 (power 283), a first switching circuit 286, a second switching circuit 287, and a resistance element 288. The driver set 29 includes a first control gate driver 291 (CG driver 1) and a second control gate driver 292 (CG driver 2).

The first switching circuit 286 transfers the output of the power supply circuit 283 to the first control gate driver 291 in a path via the resistance element 288 or a path not via the resistance element 288. The second switching circuit 287 transfers the output of the power supply circuit 283 to the second control gate driver 292 by a path not selected by the first switching circuit 286.

The boosting speed is slower by RC delay when the output of the power supply circuit 283 is transferred to the first control gate driver 291 or the second control gate driver 292 in the path via the resistance element 288 than when the output of the power supply circuit 283 is transferred to the first control gate driver 291 or the second control gate driver 292 in the path not via the resistance element 288. Therefore, for example, when the output terminal of the power supply circuit 283 and the first control gate driver 291 are connected by the first switching circuit 286 in the path via the resistance element 288 and the output terminal of the power supply circuit 283 and the second control gate driver 292 are connected by the second switching circuit 287 in the path not via the resistance element 288, the boosting speed of the voltage supplied to the wiring layer 11e can be made slower than the boosting speed of the voltage supplied to the wiring layer 11o. As a result, the operation illustrated in FIG. 14 may be implemented.

In the above configuration, the resistance element 288 is provided between the power supply circuit 283 and the wiring layer 11e.

Other operational effects which are even different from the operational effects obtained from the aspects of the foregoing embodiments should be construed as being naturally obtained from the present disclosure, as long as the operational effects are clear from the descriptions herein and may be easily predicted by one skilled in the art.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a semiconductor pillar;
a first string provided on a first side of the pillar and having a plurality of first memory cells connected in series;
first word lines respectively connected to the plurality of first memory cells;
a second string provided on a second side opposite to the first side with respect to the pillar and having a plurality of second memory cells connected in series; and
second word lines respectively connected to the plurality of second memory cells,
wherein each of the first memory cells faces, and shares a channel with, one of the second memory cells, and
when reading data of a k-th first memory cell in the first string, in an initial operation of a read operation, (where k is any integer between 1 and n, and n is equal to the number of first memory cells), a voltage level of the first word line connected to the k-th first memory cell reaches a first voltage at a first timing, and a voltage level of the second word line connected to at least one of the second memory cells other than the second memory cell in the second string facing the k-th first memory cell reaches the first voltage at a second timing that is later than the first timing, wherein the initial operation of the read operation is carried out before a read voltage for the read operation is applied to the first word line connected to the k-th first memory cell.

2. The semiconductor storage device according to claim 1, wherein in the initial operation, a rate of voltage increase in the second word line connected to said at least one of the second memory cells is less than the rate of voltage increase in the first word line connected to the k-th first memory cell.

3. The semiconductor storage device according to claim 1, wherein in the initial operation, a voltage increase in the second word line connected to said at least one of the second memory cells is started at a later time than the voltage increase in the first word line connected to the k-th first memory cell.

4. The semiconductor storage device according to claim 1, further comprising:
a first voltage supply circuit connected to the first word lines;
a second voltage supply circuit connected to the second word lines; and
a boost drive circuit configured to control the first voltage supply circuit and the second voltage supply circuit.

5. The semiconductor storage device according to claim 4, wherein the boost drive circuit supplies clock signals having different frequencies to the first voltage supply circuit and the second voltage supply circuit, respectively.

6. The semiconductor storage device according to claim 1, further comprising:
a first transistor between a power supply and the first word lines; and
a second transistor between the power supply and the second word lines.

7. The semiconductor storage device according to claim 6, wherein a control voltage is supplied to the gate terminal of the second transistor to turn on the second transistor at a later time than when a control voltage is supplied to the gate terminal of the first transistor to turn on the first transistor.

8. The semiconductor storage device according to claim 1, further comprising:
   a resistor between a power supply and the second word line connected to said at least one of the second memory cells, wherein a first resistance between the power supply and the second word line connected to said at least one of the second memory cells is greater than a second resistance between the power supply and the first word line connected to the k-th first memory cell by a third resistance, which is equal to a resistance of the resistor.

9. The semiconductor storage device according to claim 1, wherein in the initial operation, the voltage level of the second word line connected to said at least one of the second memory cells reaches the first voltage before the voltage level of the first word line connected to the k-th first memory cell drops from the first voltage and reaches the read voltage.

10. The semiconductor storage device according to claim 1, wherein the voltage level of the first word line connected to the k-th first memory cell drops from the first voltage, and at the same time, the voltage level of the second word line connected to the second memory cell in the second string facing the k-th first memory cell drops to a negative voltage.

11. A method of performing a read operation in semiconductor storage device that includes a semiconductor pillar, a first string provided on a first side of the pillar and having a plurality of first memory cells connected in series, first word lines respectively connected to the plurality of first memory cells, a second string provided on a second side opposite to the first side with respect to the pillar and having a plurality of second memory cells connected in series, and second word lines respectively connected to the plurality of second memory cells, wherein each of the first memory cells faces, and shares a channel with, one of the second memory cells, said method comprising:
   in an initial operation of a read operation to read data of a k-th first memory cell in the first string (where k is any integer between 1 and n, and n is equal to the number of first memory cells),
   increasing a voltage level of the first word line connected to the k-th first memory cell so that the first word line reaches a first voltage at a first timing; and
   increasing a voltage level of the second word line connected to at least one of the second memory cells other than the second memory cell in the second string facing the k-th first memory cell, so that the second word line reaches the first voltage at a second timing that is later than the first timing, wherein the initial operation of the read operation is carried out before a read voltage for the read operation is applied to the first word line connected to the k-th first memory cell.

12. The method according to claim 11, wherein in the initial operation, a rate of voltage increase in the second word line connected to said at least one of the second memory cells is less than the rate of voltage increase in the first word line connected to the k-th first memory cell.

13. The method according to claim 11, wherein in the initial operation, the voltage level increase in the second word line connected to said at least one of the second memory cells is started at a later time than the voltage level increase in the first word line connected to the k-th first memory cell.

14. The method according to claim 11, wherein the semiconductor storage device further includes:
   a first voltage supply circuit connected to the first word lines;
   a second voltage supply circuit connected to the second word lines; and
   a boost drive circuit configured to control the first voltage supply circuit and the second voltage supply circuit.

15. The method according to claim 14, wherein the boost drive circuit supplies clock signals having different frequencies to the first voltage supply circuit and the second voltage supply circuit, respectively.

16. The method according to claim 11, wherein the semiconductor storage device further includes:
   a first transistor between a power supply and the first word lines; and
   a second transistor between the power supply and the second word lines.

17. The method according to claim 16, wherein a control voltage is supplied to the gate terminal of the second transistor to turn on the second transistor at a later time than when a control voltage is supplied to the gate terminal of the first transistor to turn on the first transistor.

18. The method according to claim 11, wherein the semiconductor storage device further includes:
   a resistor between a power supply and the second word line connected to said at least one of the second memory cells,
   wherein a first resistance between the power supply and the second word line connected to said at least one of the second memory cells is greater than a second resistance between the power supply and the first word line connected to the k-th first memory cell by a third resistance, which is equal to a resistance of the resistor.

19. The method according to claim 11, wherein in the initial operation, the voltage level of the second word line connected to said at least one of the second memory cells reaches the first voltage before the voltage level of the first word line connected to the k-th first memory cell drops from the first voltage and reaches the read voltage.

20. The method according to claim 11, further comprising:
   decreasing the voltage level of the first word line connected to the k-th first memory cell from the first voltage to a lower voltage, and at the same time, decreasing the voltage level of the second word line connected to the second memory cell in the second string facing the k-th first memory cell to a negative voltage.

* * * * *